United States Patent
Smith et al.

(10) Patent No.: US 6,573,986 B2
(45) Date of Patent: Jun. 3, 2003

(54) METHOD AND APPARATUS FOR SELF-REFERENCED PROJECTION LENS DISTORTION MAPPING

(75) Inventors: Adlai Smith, San Diego, CA (US); Bruce McArthur, San Diego, CA (US); Robert Hunter, Jr., San Diego, CA (US)

(73) Assignee: Litel Instruments, San Diego, CA (US)

( * ) Notice: Subject to any disclaimer, the term of this patent is extended or adjusted under 35 U.S.C. 154(b) by 229 days.

(21) Appl. No.: 09/835,201

(22) Filed: Apr. 13, 2001

(65) Prior Publication Data
US 2002/0071112 A1 Jun. 13, 2002

Related U.S. Application Data
(60) Provisional application No. 60/254,271, filed on Dec. 8, 2000.

(51) Int. Cl.$^7$ ................................................ G01B 9/00
(52) U.S. Cl. ........................ 356/124; 356/401; 430/22
(58) Field of Search ............................ 356/124, 124.5, 356/125, 126, 127, 399, 400, 401; 355/52, 53; 430/22, 30

(56) References Cited

U.S. PATENT DOCUMENTS

| | | | |
|---|---|---|---|
| 4,861,148 A | 8/1989 | Sato et al. ................ | 350/505 |
| 5,285,236 A | 2/1994 | Jain ............................ | 355/53 |
| 5,402,224 A * | 3/1995 | Hirukawa et al. ........ | 356/124 |
| 5,438,413 A | 8/1995 | Mazor et al. ............. | 356/363 |
| 5,615,006 A * | 3/1997 | Hirukawa et al. ........ | 356/124 |
| 5,757,507 A | 5/1998 | Ausschnitt et al. ...... | 356/401 |
| 5,877,861 A * | 3/1999 | Ausschnitt et al. ...... | 356/401 |
| 5,894,350 A * | 4/1999 | Hsieh et al. .............. | 356/399 |
| 6,079,256 A | 6/2000 | Bareket ..................... | 73/105 |
| 6,143,621 A | 11/2000 | Tzeng et al. .............. | 438/401 |
| 6,259,525 B1 * | 7/2001 | David ........................ | 356/399 |

OTHER PUBLICATIONS

Armitage Jr., J.D. and Kirk, J.P., "Analysis of overlay distortion patterns", *SPIE*,921 :207–222, (1988).

Bjorkholm et al., "Reduction imaging at 14 nm using multilayer–coated optics: printing of features smaller than 0.1 μm", *J. Vac. Sci. Technol.B.*, 8(6):1509–1543, (1990).

Brunner, T.A., "Impact Of Lens Aberrations On Optical Lithography", *IBM Journal of Research and Development Optical Lithography* 41(1–2):57–67, (1997) (http://www.research.ibm.com/journal/rd/411/brunner.html).

Bruning et al., "Optical Lithography—Thirty years and three orders of magnitude", *SPIE*, 3051:14–27, (1997).

Cote et al., "Micrascan™ III–performance of a third generation, catadioptric step and scan lithographic tool", *SPIE* 3051:806–816, (1997).

DeJule, R., "Mix–and Match: A Necessary Choice", *Semiconductor International*, 23(2): 66–76, (Feb., 2000).

Dooly, T. and Yang, Y., "Stepper matching for optimum line performance", *SPIE*, 3051:426–432, (1997).

Goodwin, F. and Pellegrini, J.C., "Characterizing Overlay Registration of Concentric 5X and 1X Stepper Exposur Fields using Interfield Data", *SPIE*,3050:407–417, (1997).

(List continued on next page.)

*Primary Examiner*—Huy Mai
(74) *Attorney, Agent, or Firm*—Heller Ehrman White & McAuliffe LLP

(57) ABSTRACT

A projection lens distortion error map is created using standard overlay targets and a special numerical algorithm. A reticle including a 2-dimensional array of standard overlay targets is exposed several times onto a photoresist coated silicon wafer using a photolithographic stepper. After exposure, the overlay targets are measured for placement error using a conventional overlay metrology tool. The resulting overlay error data is then supplied to a software program that generates a lens distortion error map for the photolithographic projection system.

43 Claims, 17 Drawing Sheets

New Overlay reticle

Typical Detail of overlay group on New Overlay reticle (FIG. 20) as used on an M=4 lithographic projection tool. Dark=chrome, white=open

OTHER PUBLICATIONS

*Handbook of Microlithography, Micromachining, and Microfabrication*, Book: vol. 1, "Microlithography", Rai–Choudhury, P. (Ed.), SPIE Optical Engineering Press, SPIE, Bellingham, Washington, pp. 417–418, (1997).

Hasan et al., "Automated Electrical measurements of Registration Errors in Step–and–Repeat optical Lithography Systems", *IEEE Transactions on Electron Devices*, ED27(12):2304–2312, (1980).

Kenp et al., "A "golden standard" wafer design for optical stepper characterization", *SPIE*, 1464:260–266, (1991).

KLA 5105, "Linewidth and Misregistration System", KLA 5105 Product Specifications, *KLA Instruments Corporation*, 2 pages, (1995).

KLA 5200, "Value–added Overlay Metrology for Advanced Lithography", KLA 5200 Product Specifications, *KLA Instruments Corporation*, 2 pages, (1996).

Kodama, K. and Matsubara, E., "Measuring system XY–5i", *SPIE*, 2439:144–155, (1995).

Leica LMS IPRO, "Fully automated mask and wafer metrology system", *Leica*, pamphlet pp. 1–5.

Lin, B.J., "The Attenuated Phase–Shifting Mask", *Solid State Technology*, Special Series/Advanced Lithography, 35(1):43–47, (Jan., 1992).

MacMillen, D. and Ryden, W.D., "Analysis of image field placement deviations of a 5X microlithographic reductio lens", *SPIE*, 334:78–89, (1982).

Martin et al., "Measuring Fab Overlay Programs", *SPIE*, 3677:64–71 (1999).

Mc Fadden, E.A. and Ausschnitt, C.P., "A computer Aided Engineering Workstation For Registration Control", *SPIE*, 1087:255–266, (1989).

Mulkens et al., "ArF Step And Scan Exposure System For 0.15 μm Technology Node?", *SPIE*, 3679:506–521, (1999).

Newnam, B.E. and Viswanathan, V.K., "Development of XUV projection lithograph at 60–80 nm", *SPIE*, 1671:419 436, (1992).

*Numerical Recipes*, "The Art of Scientific Computing", Press et al. (Eds.), Cambridge University Press, New York pp. 52–64 (1990).

Pellegrini, J.C., "Comparisons of Six Different Intrafield Control Paradigms in an Advanced Mix–and–Match Environment", *SPIE*, 3050:398–406, (1997).

Pellegrini et al., "Super Sparse Overlay Sampling Plans: An Evaluation of Methods and Algorithms for Optimizing Overlay Quality Control and Metrology Tool Throughput", *SPIE*, 3677:72–82, (1999).

Preil, M.E. and McCormack, J.F.M., "A New Approach to Correlating Overlay and Yield", *SPIE*, 3677:208–216, (1999).

Quaestor Q7, "Fully Automated Optical Metrology System for Advanced IC Production", Quaestor Q7 Product Specification, *BIO –RAD*, 2 pages.

Raugh, M.R., "Error estimation for lattice methods of stage self–calibration", *SPIE*, 3050:614–625, (1997).

Sullivan, N.T., "Semiconductor Pattern Overlay", *SPIE Critical Reviews of Optical Science and Technology*, CR52:160–188, (1994).

Takac et al., "Self–calibration in two–dimensions: the experiment", *SPIE*, 2725:130–146, (1996).

v.d. Brink et al., "Direct–referencing automatic two–points reticle–to–wafer alignment using a projection column servo system", *SPIE*,633:60–71, (1986).

van den Brink et al., "Matching Management Of Multiple Wafer Steppers Using A Stable Standard And A Matching Simulator", *SPIE*, 1087:218–232, (1989).

van den Brink et al., "Matching Of Multiple Wafer Steppers For 0.35 μm Lithography Using Advanced Optimizatio Schemes", *SPIE*, 1926:188–207, (1993).

van den Brink et al., "Matching Performance For Multiple Wafer Steppers Using An Advanced Metrology Procedure", *SPIE*, 921:180–197, (1988).

van den Brink et al., "New 0.54 Aperture i–Line Wafer Stepper With Field By Field Leveling Combined With Glob Alignment", *SPIE*, 1463:709–724, (1991).

van Schoot et al., "0.7 NA DUV Step & Scan System For 150nm Imaging With Improved Overlay", *SPIE*, 3679:448–463, (1999).

Yost, A. and Wu, W., "Lens matching and distortion testing in a multi–stepper, sub–micron environment", *SPIE*, 1087:233–244, (1989).

Zavecz et al., "Life Beyond Mix–and–Match: Controlling Sub–0.18 μm Overlay Errors", *Semiconductor International*, 23(8):205,206,208,210,212 and 214, (Jul., 2000).

Zavecz, T.E., "Machine Models and Registration", *SPIE Critical Reviews of Optical Science and Technology*, CR52:134–159 (1994).

\* cited by examiner

Reticle schematic

Schematics for FIG. 1

Reticle Features

Overlapping regions

Perfectly centered Box-in-Box structure

Schematic for outer box 2

FIG. 5

Outer box 2 as printed on wafer.
Dark=unexposed, white=exposed

Schematic for inner box 1

FIG. 7

Inner box 1 as printed on wafer.
Dark=unexposed, white=exposed

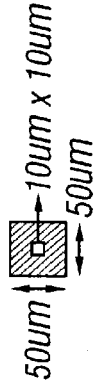

Schematic for 2-dimensional 4X0L reticle

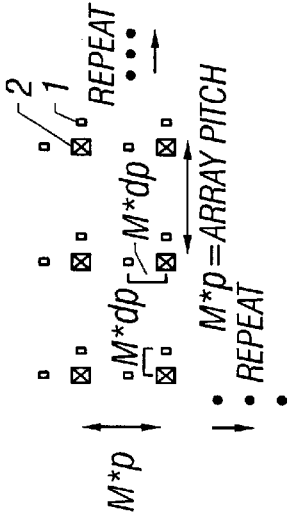

M*p
M*dp
M*dp=ARRAY PITCH
REPEAT

FIG. 9

Typical 4X0L reticle overlay set as projected onto wafer (3 featured parts); dark=unexposed, white=exposed

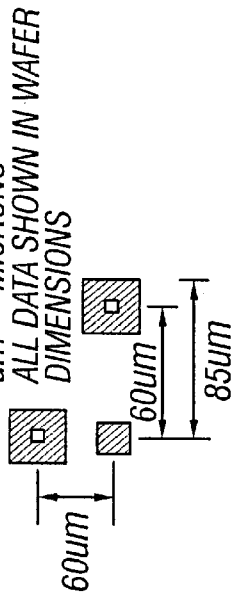

um = MICRONS
ALL DATA SHOWN IN WAFER DIMENSIONS

Schematic of X-shear overlay on wafer

Schematic of Y-shear overlay on wafer

2-Dimensional reticle schematic, 90 degree overlay or R-shear.

Process-flow for the second embodiment for self-referencing lens distortion measurement.
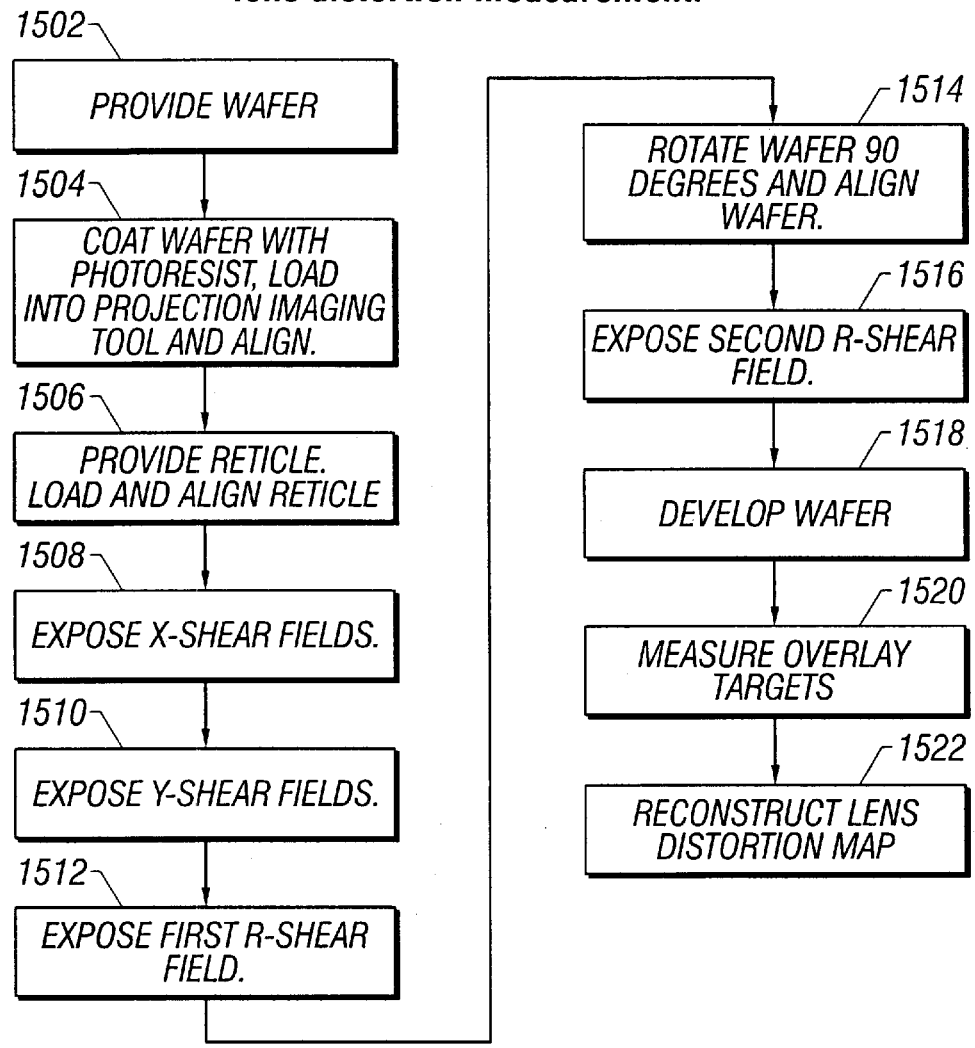
FIG. 15
Some components of overlay or placement error (Inter-field and Intra-field)
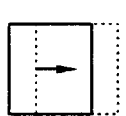  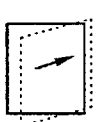 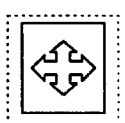
TRANSLATION  ROTATION  NON-ORTHOGONALITY  SCALE OR MAGNIFICATION
FIG. 16

Typical Detail of overlay group on New Overlay reticle (FIG. 20) as used on an M=4 lithographic projection tool. Dark=chrome, white=open New Overlay reticle

*Intra-field indices projected onto the wafer*

*Side view of reticle of FIG. 20*

Example of prior art lens distortion test

Wafer with alignment marks at 0 and 90 degrees

Wafer after exposure of FIG. 20 overlay reticle at the 0 degree orientation

Wafer after exposure of FIG. 20 overlay reticle at the 0 and 90 degree orientations (clockwise)

Detail of R-shear pattern on wafer

Closeup of overlay groups for R-shear

Single Box-in-Box target.
dark = undeveloped photoresist
white = no photoresist

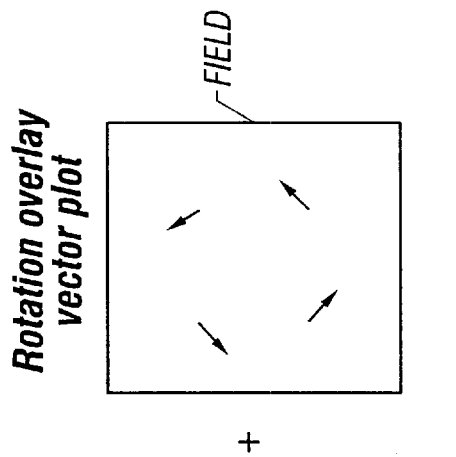
FIG. 30 Rotation overlay vector plot
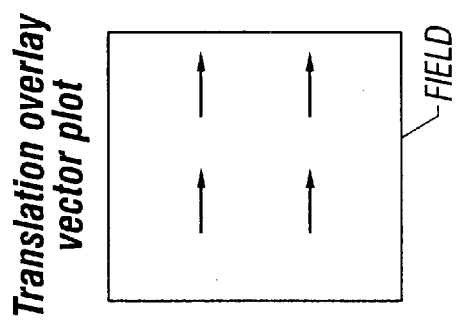
FIG. 29 Translation overlay vector plot
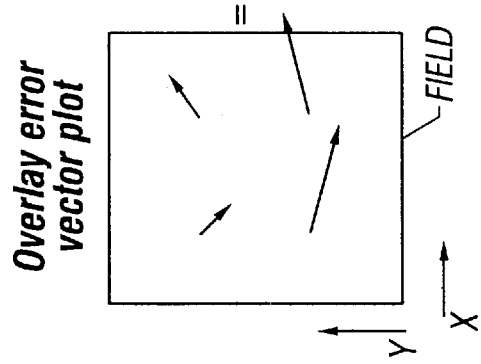
FIG. 28 Overlay error vector plot
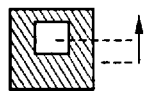
FIG. 31 Overlay measurement
THE VECTOR REPRESENTS THE ALIGNMENT OFFSET DISTANCE BETWEEN THE BOX-IN-BOX STRUCTURE

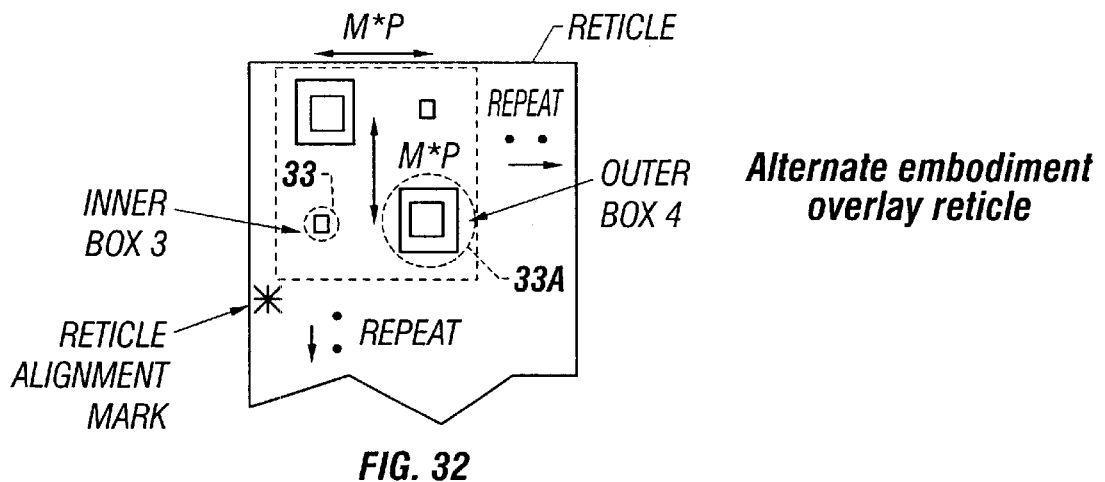
FIG. 32 — Alternate embodiment overlay reticle
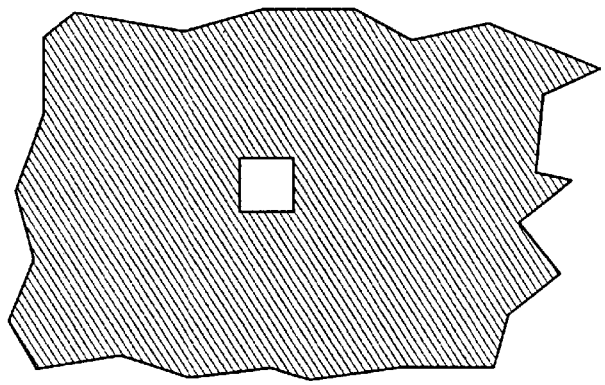
Inner box 3 on reticle. Dark=chrome, white=open.
FIG. 33
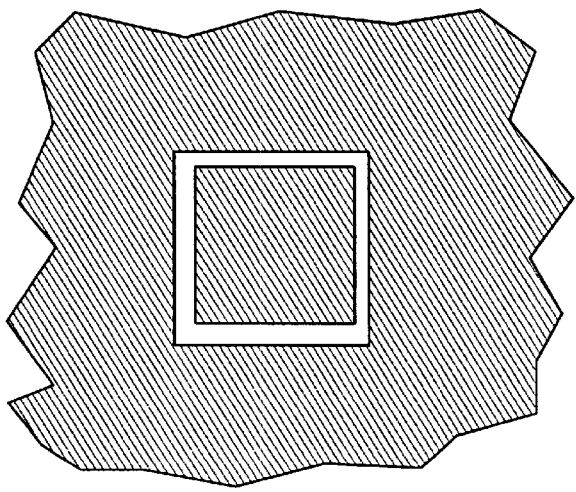
Outer box 4 on reticle. Dark=chrome, white=open.
FIG. 33A

Process flow for the preferred embodiment for self-referencing lens distortion measurement.

Process flow for the alternate embodiment utilizing sub-Eo exposure doses on the wafer.

Wafer after exposure of FIG. 20 overlay reticle for X and Y shears.

Detail of Y-shear for a 2 x 2 set of overlay groups

Detail of X-shear for a 2 x 2 set of overlay groups.

Final results of the method of this invention.
Units = microns, (xf, yf) = intra-field location,
(dxf, dyf) = intra-field distortion at point (xf, yf).

```
Machine id: DUVF11-02
    Xf              yf           dxf         dyf
-10000.000    -10000.000       -0.139       0.044
 -8000.000    -10000.000        0.223      -0.233
 -6000.000    -10000.000        0.498       0.004
     .             .              .           .
     .             .              .           .
     .             .              .           .
 10000.000     10000.000        0.099      -0.188
```

METHOD AND APPARATUS FOR SELF-REFERENCED PROJECTION LENS DISTORTION MAPPING

REFERENCE TO PRIORITY DOCUMENT

This application claims the benefit of U.S. Provisional Application No. 60/254,271, filed on Dec. 8, 2000.

BACKGROUND OF THE INVENTION

1. Field of the Invention

The present invention relates generally to optical metrology and more particularly to characterizing and monitoring the intra-field distortions of projection imaging systems used in semiconductor manufacturing.

2. Description of the Related Art

Today's lithographic processing requires ever tighter layer-to-layer overlay tolerances to meet device performance requirements. Overlay registration is defined as the translational error that exists between features exposed layer to layer in the vertical fabrication process of semiconductor devices on silicon wafers. Other names for overlay registration include, registration error and pattern placement error, and overlay error. Overlay registration on critical layers can directly impact device performance, yield and repeatability. Increasing device densities, decreasing device feature sizes and greater overall device size conspire to make pattern overlay one of the most important performance issues during the semiconductor manufacturing process. The ability to accurately determine correctable and uncorrectable pattern placement error depends on the fundamental techniques and algorithms used to calculate lens distortion, stage error, and reticle error.

A typical microelectronic device or circuit may consist of 20–30 levels or pattern layers. The placement of pattern features on a given level must match the placement of corresponding features on other levels, i.e., overlap, within an accuracy which is some fraction of the minimum feature size or critical dimension (CD). Overlay error is typically, although not exclusively, measured with a metrology tool appropriately called an overlay tool using several techniques. See for example, Semiconductor Pattern Overlay, N. Sullivan, SPIE Critical Reviews Vol. CR52, 160:188. The term overlay metrology tool or overlay tool means any tool capable of determining the relative position of two pattern features or alignment attributes, that are separated within 500 um (microns) of each other. The importance of overlay error and its impact to yield can be found elsewhere. See Measuring Fab Overlay Programs, R. Martin, X. Chen, I. Goldberger, SPIE Conference on Metrology, Inspection, and Process Control for Microlithography XIII, 64:71, March, 1999; New Approach to Correlating Overlay and Yield, M. Preil, J. McCormack, SPIE Conference on Metrology, Inspection, and Process Control for Microlithography XIII, 208:216, March, 1999.

Lithographers have created statistical computer algorithms (for example, Klass II and Monolith) that attempt to quantify and divide overlay error into repeatable or systematic and non-repeatable or random effects. See Matching of Multiple Wafer Steppers for 0.35 micron Lithography using advanced optimization schemes, M. van den Brink, et. Al., SPIE VOL. 1926, 188:207, 1993; A Computer Aided Engineering Workstation for registration control, E. McFadden, C. Ausschnitt, SPIE Vol. 1087, 255:266, 1989; Semiconductor Pattern Overlay, supra; Machine Models and Registration, T. Zavecz, SPIE Critical Reviews Vol. CR52, 134:159. An overall theoretical review of overlay modeling can be found in Semiconductor Pattern Overlay, supra.

Overlay error is typically divided into the following two major categories. The first category, inter-field or grid overlay error, is concerned with the actual position of the overall device pattern imaged into the photoresist on a silicon wafer using an exposure tool, i.e., stepper or scanner as referenced from the nominal center of the wafer, see FIG. 18.

Obviously, the alignment of the device pattern on the silicon wafer depends on the accuracy of the stepper or scanner wafer handling stage or wafer stage. Overlay modeling algorithms typically divide inter-field or grid error into five sub-categories or components, each named for a particular effect: translation, rotation, magnification or scale (in both x and y directions), non-orthogonality, and residuals. See A Computer Aided Engineering Workstation for registration control, supra.

The second category, intra-field overlay error, is the positional offset of an individual point inside a field referenced to the nominal center of an individual exposure field, as illustrated in FIG. 19. The term "nominal center" means the exact location of the center of a "perfectly" aligned exposure field; this is the same as the requested field center coordinates given to the lithography tool when it is programmed for the job. Intra-field overlay errors are generally related to lens aberrations, scanning irregularities, and reticle alignment. Four sub-categories or components of intra-field overlay error include: translation, rotation, magnification and lens distortion. It is common practice to make certain assumptions concerning the magnitude and interaction of stage error and lens distortion error in modern overlay algorithms that calculate lens distortion. The common rule is: "trust the accuracy of the stage during the creation of the overlay targets by making the simple assumption that only a small amount of stage error is introduced and can be accounted for statistically". See A "golden standard" wafer design for optical stepper characterization, K. Kenp, C. King, W. W, C. Stager, SPIE Vol. 1464, 260:266, 1991; Matching Performance for multiple wafer steppers using an advanced metrology procedure, M. Van den Brink, et. Al., SPIE Vol. 921, 180:197, 1988.

It is important for this discussion to realize that most overlay measurements are made on silicon product wafers after each photolithographic process, prior to final etch. Product wafers cannot be etched until the resist target patterns are properly aligned to the underlying target patterns. See Super Sparse overlay sampling plans: An evaluation of Methods and Algorithms for Optimizing overlay quality control and Metrology tool Throughput, J. Pellegrini, SPIE Vol. 3677, 72:82, 36220. Manufacturing facilities rely heavily on exposure tool alignment and calibration procedures. See Stepper Matching for Optimum line performance, T. Dooly, Y. Yang, SPIE Vol. 3051, 426:432, 1997; Mix-And-Match: A necessary Choice, R. DeJule, Semiconductor International, 66:76, Feb, 2000; Matching Performance for multiple wafer steppers using an advanced metrology procedure, supra, to help insure that the stepper or scanner tools are aligning properly; inaccurate overlay modeling algorithms can corrupt the exposure tool calibration procedures and degrade the alignment accuracy of the exposure tool system. See Super Sparse overlay sampling plans: An evaluation of Methods and Algorithms for Optimizing overlay quality control and Metrology tool Throughput, supra.

Over the past 30 years the microelectronics industry has experienced dramatic rapid decreases in critical dimension by moving constantly improving photolithographic imaging systems. Today, these photolithographic systems are pushed to performance limits. As the critical dimensions of semiconductor devices approach 50 nm the overlay error requirements will soon approach atomic dimensions. See Life Beyond Mix-and-Match: Controlling Sub-0.18 micron Overlay Errors, T. Zavecz, Semiconductor International, July, 2000. To meet the needs of next generation device specifications new overlay methodologies will need to be developed. In particular, overlay methodologies that can accurately separate out systematic and random effects and break them into assignable causes will greatly improve device process yields. See A New Approach to Correlating Overlay and Yield, supra.

In particular, those new overlay methodologies that can be implemented into advanced process control or automated control loops will be most important. See Comparisons of Six Different Intra-field Control Paradigms in an advanced mix and match environment, J. Pellegrini, SPIE Vol. 3050, 398:406, 1997; Characterizing overlay registration of concentric 5× and 1× stepper Exposure Fields using Inter-field Data, F. Goodwin, J. Pellegrini, SPIE Vol. 3050, 407:417, 1997. Finally, another area where quantifying lens distortion error is of vital concern is in the production of photomasks or reticles during the electron beam manufacturing process. See Handbook of Microlithography and Microfabrication Vol. 1 P. Rai- Choudhury 1997 pg. 417.

Semiconductor manufacturing facilities generally use some version of the following complex overlay procedure to help determine the magnitude of lens distortion independent of other sources of systematic overlay error. The technique has been simplified for illustration. See Analysis of image field placement deviations of a 5× microlithographic reduction lens, D. MacMillen, et. Al., SPIE Vol. 334, 78:89, 1982. FIGS. 2 and 3 show typical sets of overlay targets 300, including—one large or outer box 302 and one small or inner target box 304. FIG. 1 shows a typical portion of a distortion test reticle 102 used in the prior art. It should be noted that the chrome target patterns on most reticles are 4 or 5 times larger as compared with the patterns they produce at the image plane; this simply means modern steppers are reduction systems. Further, for purposes of discussion, it is assumed that the reticle pattern is geometrically perfect, (in practice, the absolute positions of features on the reticle can be measured and the resulting errors subtracted off). First, a wafer covered with photoresist is loaded onto the wafer stage and globally aligned. Next, the full-field image of the reticle, 102 in FIG. 1 is exposed onto the resist-coated wafer 2102 in FIG. 21. For purposes of illustration, we assume that the distortion test reticle consists of a 5×5 array of outer boxes evenly spaced a distance M*P, across the reticle surface see FIG. 1. It is typically assumed that the center of the optical system is virtually aberration free. See Analysis of image field placement deviations of a 5× microlithographic reduction lens, supra. With this assumption, the reticle, 102 in FIG. 1 is now partially covered using the reticle blades, 1704 in FIG. 17, in such a way that only a single target at the center of the reticle field, box 104, in FIG. 1, is available for exposure. Next, the wafer stage is moved in such a way as to align the center of the reticle pattern directly over the upper left hand corner of the printed 5×5 outer box array, wafer position 2106, FIG. 21. The stepper then exposes the image of the small target box onto the resist-coated wafer. If the stepper stage and optical system were truly perfect then the image of the small target box would fit perfectly inside the image of the larger target box, as illustrated in FIGS. 4 and 21, from the previous exposure.

At this point the stepper and wafer stage are programmed to step and expose the small target box in the 5×5 array where each exposure is separated from the previous one by the stepping distance P. With the assumption of a perfect stage, the final coordinates of the small target boxes are assumed to form a perfect grid, where the spacing of the grid is equal to the programmed stepping distance, P. Finally, if the first full-field exposure truly formed a perfect image, then the entire 5×5 array of smaller target boxes would fit perfectly inside the 5×5 array of larger target boxes as illustrated in FIG. 4A. Since the first full-field exposure pattern is in fact distorted due to an imperfect imaging system the actual position of the larger target box will be displaced relative to the smaller target boxes for example, as shown in FIG. 31. The wafer is then sent through the final few steps of the photographic process to create the final resist patterned overlay targets. The overlay error at each field position, see FIGS. 28, 29, and 30, can be measured with a standard optical overlay tool and displayed in vector notation see FIGS. 28–30. Using the models described below (eq1 and eq2) the overlay data are analyzed, and the lens distortion error is calculated.

The following inter-field and intra-field modeling equations are commonly used to fit the overlay data using a least square regression technique. See Analysis of image field placement deviations of a 5× microlithographic reduction lens, supra.

$$dxf(xf,yf)=Tx+s*xf-q*yf+t1*xf^2+t2*xf*yf-E*(xf^3+xf*yf^2) \quad \text{(eq 1)}$$

$$dyf(xf,yf)=Ty+s*yf+q*xf+t2*yf^2+t1*xf*yf-E*(yf^3+yf*xf^2) \quad \text{(eq 2)}$$

where (xf,yf)=intra-field coordinates (dxf, dyf)(xf,yf)=intra-field distortion at position (xf, yf)

(Tx, Ty)=(x,y) intra-field translation s=intra-field overall scale or magnification q=intra-field rotation (t1, t2)=intra-field trapezoid error E=intra-field lens distortion.

A problem with the this technique is two-fold; first, it is standard practice to assume that the wafer stage error is very small, randomly distributed, and can be completely accounted for using a statistical model. See Analysis of image field placement deviations of a 5× microlithographic reduction lens, supra; A "golden standard" wafer design for optical stepper characterization, supra; Matching Management of multiple wafer steppers using a stable standard and a matching simulator, supra; Matching Performance for multiple wafer steppers using an advanced metrology procedure, supra. In general, the wafer stage introduces both systematic and random errors, and since the lens distortion is measured only in reference to the lithography tool's wafer stage, machine to machine wafer stage differences show up as inaccurate lens distortion maps. Secondly, the assumption that lens distortion is zero at the center of the lens is incorrect.

A technique for stage and 'artifact' self-calibration is described in See Self-calibration in two-dimensions: the experiment, M. Takac, J. Ye, M. Raugh, R. Pease, C. Berglund, G. Owen, SPIE Vol. 2725, 130:146, 1996; Error estimation for lattice methods of stage self-calibration, M. Raugh, SPIE. Vol. 3050, 614:625, 1997. It consists of placing a plate (artifact) with a rectangular array of measurable targets on a stage and measuring the absolute positions of the targets using a tool stage and the tool's image acquisition or alignment system. This measurement process is repeated by reinserting the artifact on the stage but shifted by one target spacing in the X-direction, then repeated again with the artifact inserted on the stage shifted by one target spacing in the Y-direction. Finally, the artifact is inserted at 90-degrees relative to its' initial orientation and the target positions measured. The resulting tool measurements are a set of (x, y) absolute positions in the tool's nominal coordinate system. Then, the absolute positions of both targets on the artifact and a mixture of the repeatable and non-repeatable parts of the stage x, y grid error are then determined to within a global translation (Txg, Tyg), rotation (qg) and overall scale ((sxg+syg)/2) factor. This technique is not directly applicable to the present situation since it requires that the measurements be performed on the same machine that is being assessed by this technique. Furthermore, this prior art technique requires measurements made on a tool in absolute coordinates; the metrology tool measures the absolute position of the printed targets relative to it's own nominal center; so absolute measurements are required over the entire imaging field (typical size>~100 mm^2).

Therefore there is a need for an effective way to determine the lens distortion of a projection system independent of other sources of systematic overlay error.

SUMMARY OF THE INVENTION

A projection lens distortion error map is created using standard overlay targets and a special numerical algorithm. A reticle including of a 2-dimensional array of standard overlay targets is exposed several times onto a photoresist coated silicon wafer using a photolithographic stepper or scanner. After exposure, the overlay target patterns are measured for placement error using a conventional overlay metrology tool. The resulting overlay data are then supplied to a software program that generates a lens distortion map for the photolithographic projection system. The technique does not require the use of a special reference wafer in order to obtain a complete set of lens distortion data.

One feature is that the technique is both self-consistent and self-referenced thus making the procedure easy to implement in production environments. Most importantly, the technique determines all lens distortion error excluding total translational, rotational, orthogonality and x and y scale placement errors. In addition, the results are decoupled from the effects of stage, wafer alignment, and reticle alignment error. Decoupling these errors from lens distortion error allows the user to more accurately model other sources of placement error in the lithographic process. The technique can be adjusted for accuracy by simply adjusting the number of measurements or stepping patterns used to create the overlay targets.

One aspect includes exposing and printing a minimum of 4 full-field overlay targets at strategic locations across the wafer. Another aspect includes 6 full-field exposures but determines the lens distortion error to within translation, rotation and overall scale or magnification. Additional aspects allow for further reduction of the effects of overlay metrology tool noise.

The technique forms a methodology that can be modified slightly to achieve varying degrees of overall accuracy. Also, the technique can easily be implemented in a modern semiconductor manufacturing facility. For example, a stepper prints the full field of an overlay target reticle 2002 in FIG. 20, onto a resist coated silicon wafer 2402 in FIG. 24 using four exposures. The exposures occur in pairs labeled X and Y in FIG. 24. One pair of exposures denoted X, 3502, in FIG. 35 consists of a first exposure at some nominal position illustrated by the outline of field in solid line, and a second exposure illustrated by a dotted line, shifted in the X-direction by a distance p+dp as illustrated in FIG. 35B. This results in two overlapped fields as shown in FIGS. 11 and 35B. Another pair of exposures (denoted Y, 3504, in FIG. 35 consists of a first exposure at some nominal position illustrated by the outline of field in solid line and a second exposure illustrated by a dotted line shifted in the Y-direction by a distance p+dp as illustrated in FIG. 35A. This results in two overlapped fields as shown in FIGS. 12 and 35A. The resulting exposure patterns are then developed-out or delineated using a standard photolithographic process. The patterned overlay targets, or printed feature targets illustrated in FIGS. 11, 12, and 27, are then measured using a standard optical metrology tool currently available from commercial vendors such as KLA-Tencor of San Jose [Model 5200, See KLA 5105 overlay brochure, KLA-Tencor; KLA 5200 overlay brochure, KLA-Tencor] or Bio-Rad Semiconductor Systems of Mountain View, Calif. [Model Quaestor Q7, See Quaestor Q7 Brochure, Bio-rad Semiconductor Systems].

Because the technique utilizes a high precision overlay metrology tool for local measurements and extracts the global lens distortion data in a unique way means the metrology error multiplier is kept near unity. In addition, the technique can be used in conjunction with traditional overlay techniques to better understand, model and correct pattern placement errors. Additional applications of the above outlined procedure include: improved lithographic simulation using conventional optical modeling software, advanced process control in the form of feedback loops that automatically adjust the projection lens for optimum performance, and reticle correction algorithms that compensate for lens aberration. The technique forms a self-referenced methodology that does not require a special set of overlay calibration wafers or assumptions concerning the placement accuracy of the stage.

BRIEF DESCRIPTION OF THE DRAWINGS

The features of this invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

FIG. 5 is the schematic for outer box 2 of FIG. 9;

FIG. 6 is outer box 2 as printed on the wafer;

FIG. 7 is the schematic for inner box 1 of FIG. 9;

FIG. 8 is inner box 1 as printed on the wafer;

FIG. 9 is a schematic for 2-dimensional 4XOL reticle;

FIG. 10 is a typical 4XOL reticle overlay set as projected onto the wafer;

FIG. 15 is the process for the second embodiment of this invention;

FIG. 16 illustrates some components of overlay or placement error;

FIG. 28 shows an overlay error vector plot;

FIG. 29 shows the overlay error due to translation;

FIG. 30 shows the overlay error due to rotation;

FIG. 31 shows an overlay measurement;

FIG. 32 shows an alternate embodiment overlay reticle;

FIG. 33 details inner box 3 of FIG. 32;

FIG. 33A details outer box 4 of FIG. 32;

DETAILED DESCRIPTION OF THE INVENTION

Outline of the General Theory

Figure 14:
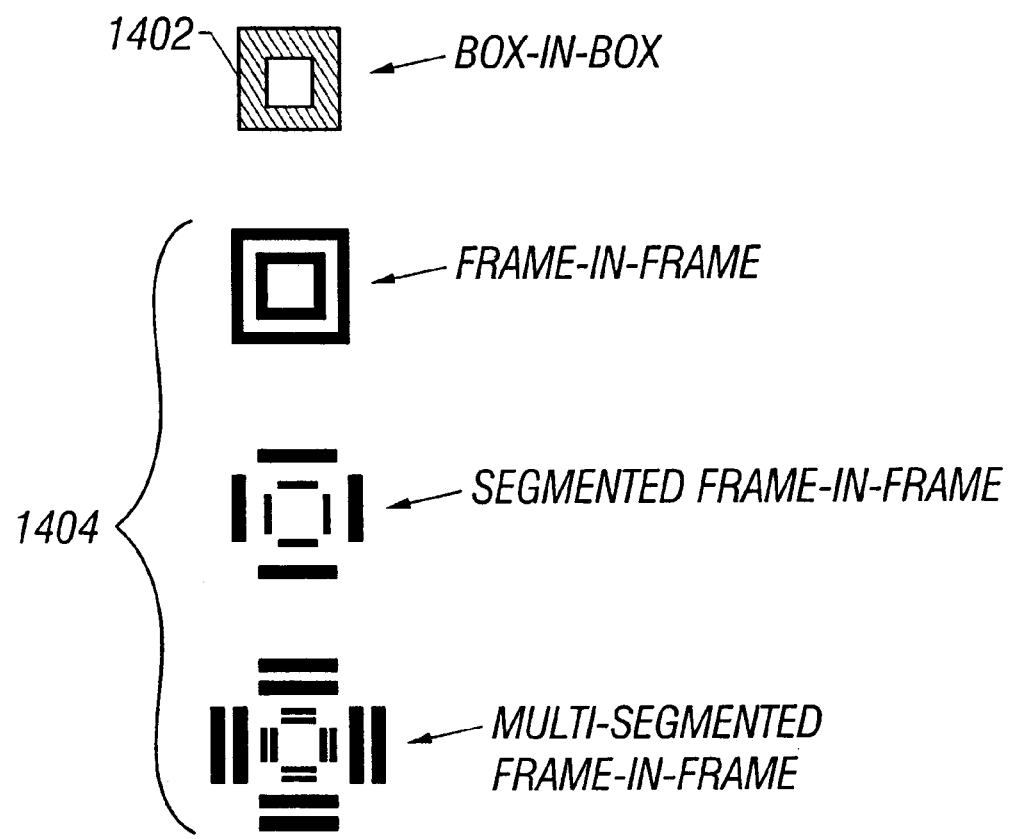
FIG. 14 are typical overlay patterns or alignment attributes.
Figure 17:
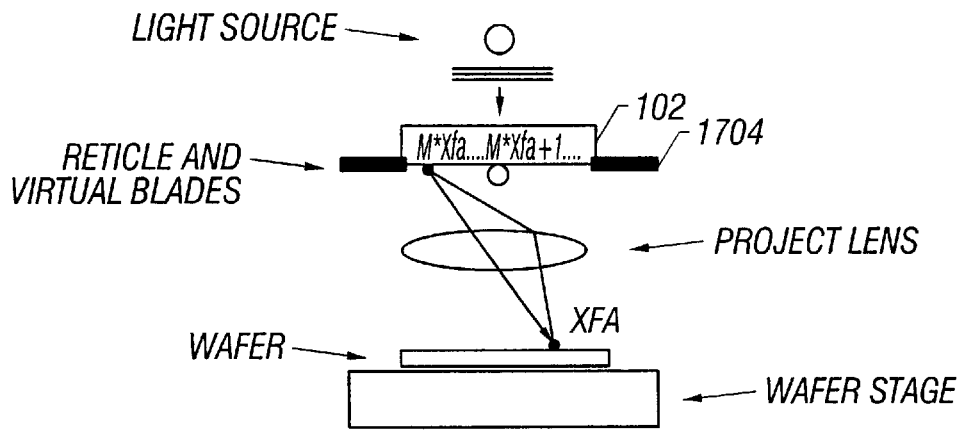
FIG. 17 is a photolithographic stepper or scanner system.
Figure 18:
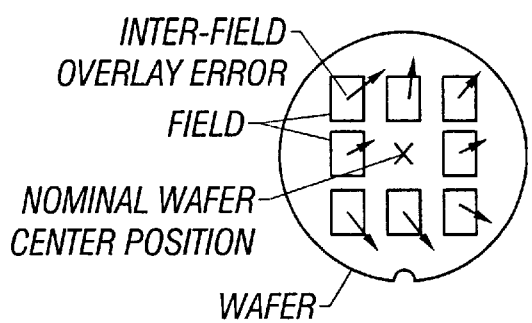
FIG. 18 is an example of inter-field overlay error.
Figure 19:
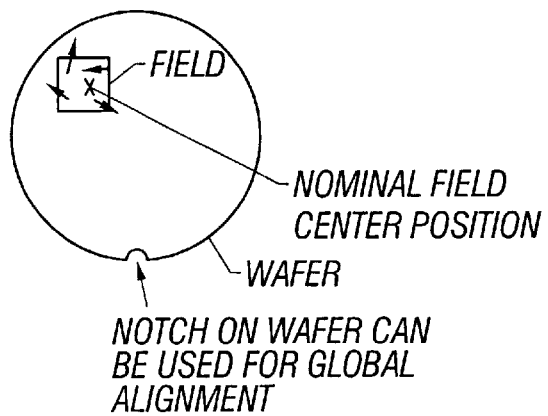
FIG. 19 is an example of intra-field overlay error.

Overlay error is referred to as overlay registration including, registration error and pattern placement error; for our work here, we will simply use the term overlay error or error. For classification purposes, overlay error is typically divided into the following two categories: grid or inter-field and intra-field error. Intra-field error is the overlay error in placement within a projection field, or simply field, of a lithographic projection system. Inter-field error is the overlay error from field to field on the wafer. The physical sources of these errors are generally distinct; inter-field error is due to imaging objective aberrations or possibly scanning dynamics while intra-field errors are due to the wafer alignment system and the wafer stage. The focus of this invention is determination of intra-field error. In order to measure overlay error using conventional optical metrology tools, special alignment attributes or overlay target patterns, such as the ones shown in FIG. 14, are printed or imaged onto a properly designed recording media using a photolithographic imaging system such as the one illustrated in FIG. 17. Here recording media is meant to include: positive or negative photoresist, optically activated liquid crystals, CCD or diode imaging arrays, and photographic film. There are many different kinds of alignment attributes including, box-in-box 1402, frame-in-frame 1404 as shown in FIG. 14, as well as gratings, verniers, and electrical test structures. See Automated Electrical Measurements of Registration Errors in Step and Repeat Optical Lithography systems, T. Hasan, et. Al., IEEE Transactions on Electron Devices, Vol. ED-27, No. 12, 2304:2312, December, 1980; Capacitor Circuit Structure For Determining Overlay Error, K. Tzeng, et. Al., U.S. Pat. No. 6,143,621, 2000; Overlay Alignment Measurement of Wafers, N. Bareket, U.S. Pat. No. 6,079,25, 2000. The present invention applies to photolithographic steppers, scanners, e-beam systems, EUV and x-ray imaging systems. See Mix-And-Match: A necessary Choice, supra; Reduction imaging at 14 nm using multilayer-coated optics: Printing of features smaller than 0.1 micron, J. Bjorkholm, et. Al., Journal Vacuum Science and Technology,B 8(6), 1509:1513, November/December 1990; Development of XUV projection lithography at 60–80 nm, B. Newnam, et. Al., SPIE vol. 1671, 419:436, 1992; Optical Lithography—Thirty years and three orders of magnitude, J. Binning, SPIE Vol. 3051, 14:27, 1997. FIG. 28 shows a typical vector plot of overlay error measured with a commercial overlay tool using box-in-box structures. In some cases the overlay error can be measured using special in-situ exposure tool metrology. See Matching Management of multiple wafer steppers using a stable standard and a matching simulator, M. Van den Brink, et. Al., SPIE VOL. 1087, 218:232, 1989. Vector displacement plots like those illustrated in FIG. 28 give a visual description of the direction, magnitude, and location of overlay error, and are mathematically separated into components using variety of regression routines; FIGS. 28–30 are a schematic of this while Analysis of overlay distortion patterns, J. Armitage, J. Kirk, SPIE Vol. 921, 207:221, 1988 contains numerous examples. Many commercial software packages exist (Monolith, See A Computer Aided Engineering Workstation for registration control, supra., Kiass II; See Lens Matching and Distortion testing in a multi-stepper, sub-micron environment, A. Yost, et. al., SPIE Vol. 1087, 233:244, 1989) that model and statistically determine the relative magnitude of the systematic and random inter-field and intra-field error components for the purpose of process control and exposure tool set-up. Once the inter-field and intra-field overlay data are analyzed the results are used to adjust the calibration constants and absolute position of the reticle stage, wafer handling stage and projection lens system to improve pattern alignment.

Preferred Embodiment

Figure 20A:
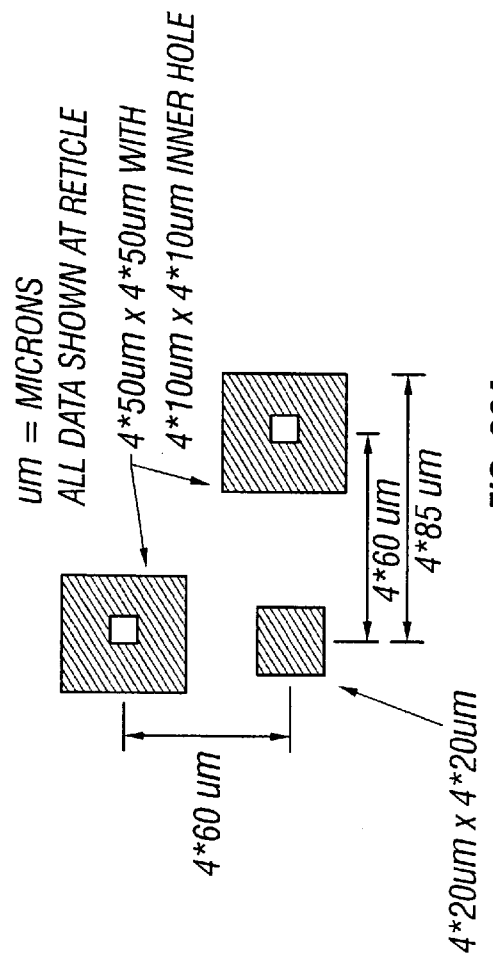
FIG. 20A shows the typical detail of the individual overlay groups of FIG. 20.
Figure 20:
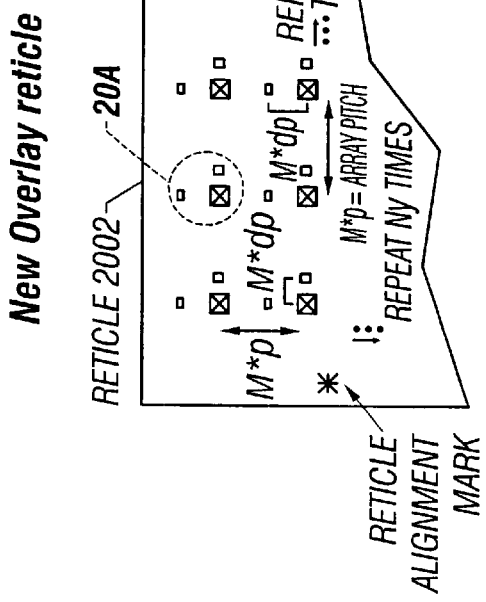
FIG. 20 is shows the overlay reticle of this invention.
Figure 34:
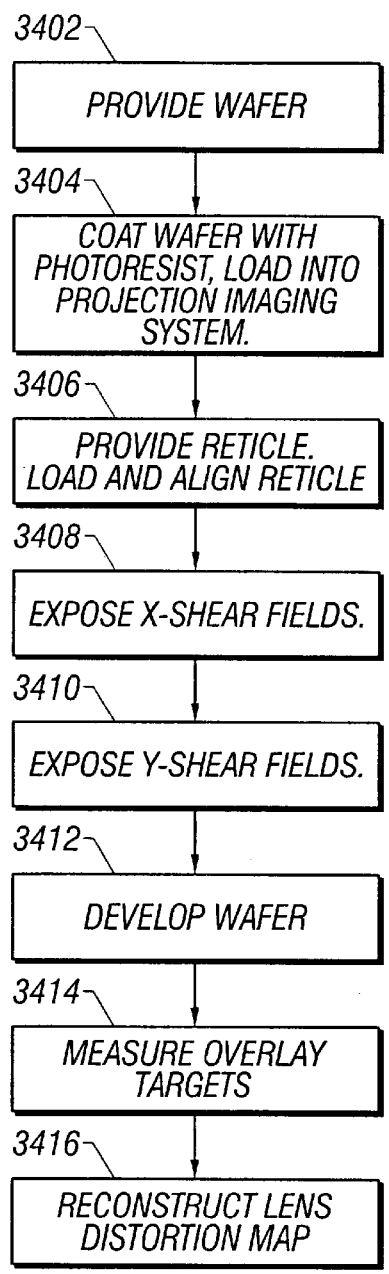
FIG. 34 shows the process flow for the preferred embodiment of this invention.

A simple and accurate methodology that allows for the extraction of lens distortion placement error excluding total translation, rotation, orthogonality and x and y scale error and is mathematically decoupled from stage error is described. FIG. 34 illustrates the methodology in terms of a process flow diagram. First, in block 3402, a wafer is provided; wafer alignment marks are not required; a bare wafer can be used. Next, in block 3404, the wafer is coated with resist and loaded onto the projection imaging system or machine. Then in block 3406, a reticle pattern such as illustrated in FIG. 20, including a two dimensional array of box structures or targets of various sizes, see FIG. 20A, is loaded into the machine's reticle management system and aligned to the reticle table. The reticle pattern be, for example, Nx×Ny array of overlay groups as shown in FIG. 20A with a portion of the whole Nx×Ny array being schematically shown in FIG. 20.

Figure 35:
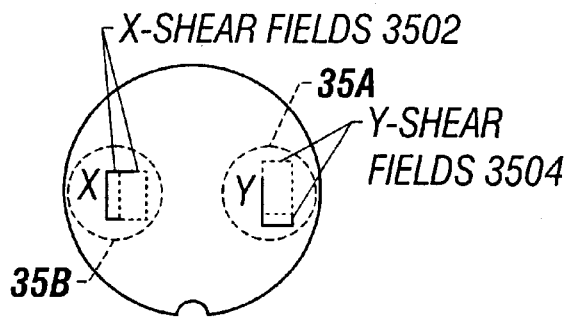
FIG. 35 shows the wafer after exposure of the X and Y shears.
Figure 35A:
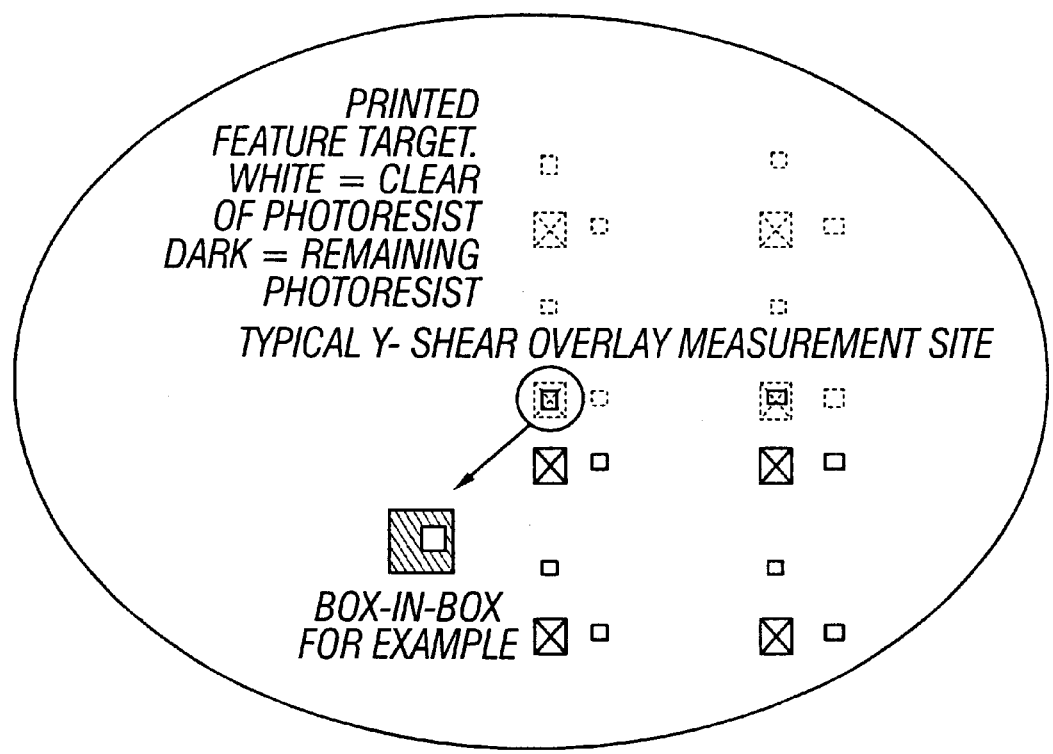
FIG. 35A details the Y shear of FIG. 35.
Figures 35B, 36:
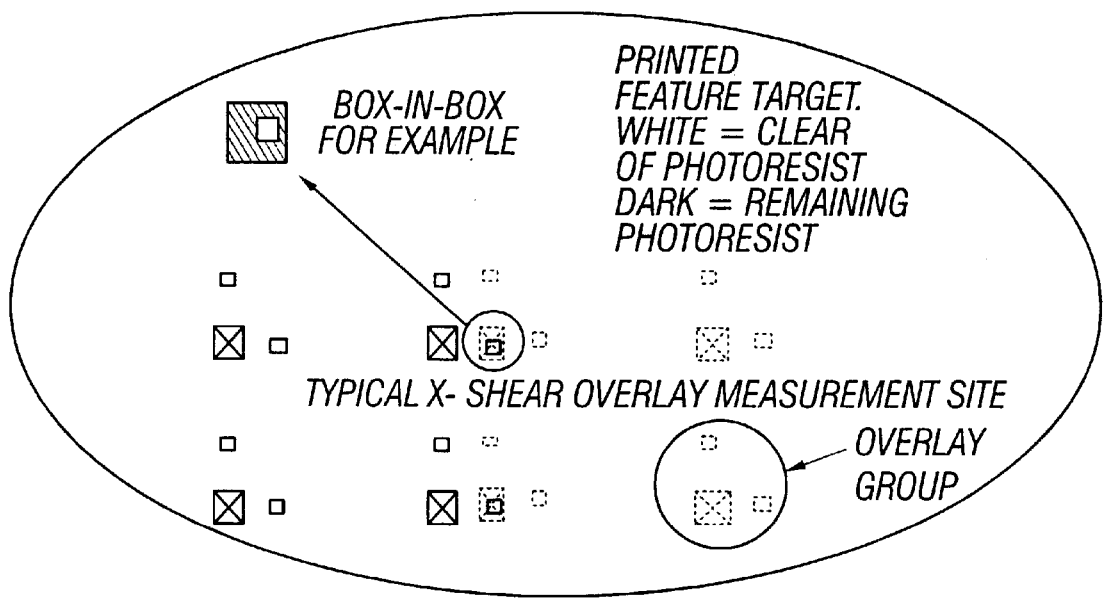
FIG. 35B details the X shear of FIG. 35.
FIG. 36 shows the final results of the method of this invention.

Then in blocks 3408 and 3410 the reticle pattern is exposed at two field positions across the wafer illustrated by the solid outlines in FIG. 35, with the field center at grid positions (xX1, yX1), (xY1, yY1) representing the first exposure for the X-shear and Y-shear respectively. To minimize confusion, these exposure fields are typically separated by a distance>120% *max(Lx, Ly), where the exposure field has rectangular dimension Lx×Ly. Each full-field exposure produces an Mx×My array (Mx<=Nx, My<=Ny) of overlay groups at the wafer surface; FIGS. 35A and 35B illustrate the Mx=My=2 case.

Using the same reticle shown in FIG. 20 the wafer stage is blind stepped to expose the second layer of the X-shear pattern with field center located at nominal grid position (xX1+p+dp, yX1). Referring to FIGS. 20 and 20A, M*p is the feature pitch or period of the overlay group on the reticle while M*dp is the offset of the inner box structures within the overlay group from the outer box structures. M is the reduction magnification ratio (M=4 or 5 typically) of the machine so that p is the pitch of overlay groups on the wafer while dp is the wafer offset of inner and outer boxes within an overlay group.

FIGS. 35A and 35B show the Y and X shears for an Mx×My=2×2 array. The entire X-shear pattern consists of a set of Mx−1×My overlapped box in box structures as illustrated in FIG. 35B. Typical values for p are in the range of about 0.5 mm to about 10 mm while typical values for dp are in the range of about 0.02 mm to 1 mm. A constraint on p is that it be small enough to provide detailed enough coverage of the lens distortion pattern. Stated differently, the lens distortion should be sampled at a fine enough interval such that the distortions at the unmeasured locations in between the overlay groups are reasonably approximated (<30% error) by interpolating the values of lens distortion measured on pitch p. A constraint on offset dp is that it lie within an area where the lens distortion is not varying significantly. Stated differently, the overlay group as shown in FIG. 20A, should lie within an isoplanatic distortion patch of the lens, herein defined as being a region over which the lens distortion varies by <5% of the maximum value of the lens distortion.

Again using the same reticle as shown in FIG. 20, the wafer stage is blind stepped to expose the second layer of the Y-shear pattern with field center located at nominal grid position (xY1, yY1+p+dp). FIG. 35A shows the pattern for an Mx×My=2×2 array. The entire pattern consists of a set of Mx×My−1 overlapped box in box structures as shown in FIG. 35B.

Next, in block 3412, the wafer is developed and sent to the overlay tool where in block 3414 the following sets of overlay targets are measured:

X-shears Mx−1×My array (eq 3)

Y-shears Mx×My−1 array (eq 4).

Then in block 3416 we reconstruct the overlay measurements that are used to produce the lens distortion map.

Figure 20B:
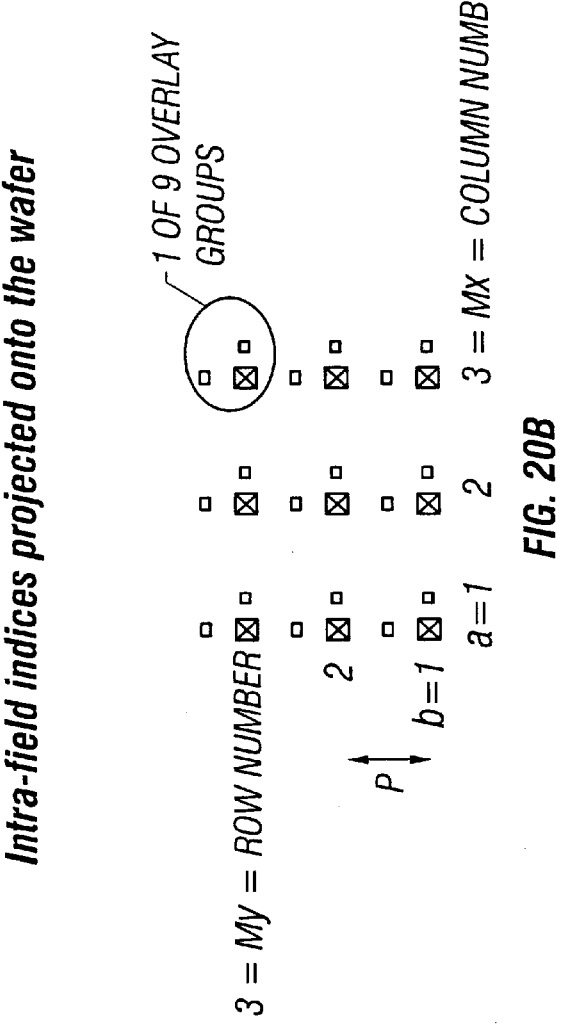
FIG. 20B shows Intra-field indices projected onto the wafer.

The X-shear measurements can be modeled as:

$$BBx(a,b;X)=[xf(a+1)+dxf(a+1,b)+Tx1-q1*yf(b)]-[xf(a)+p+dxf(a,b)+Tx2-q2*yf(b)]=dxf(a+1,b)-dxf(a,b)+(Tx1-Tx2)-(q1-q2)*yf(b) \quad (eq\ 5)$$

$$BBy(a,b;X)=[yf(b)+dyf(a+1,b)+Ty1+q1*xf(a+1)]-[yf(b)+dyf(a,b)+Ty2+q2*xf(a)]=dyf(a+1,b)-dyf(a,b)+(Ty1-Ty2)+(q1*xf(a+1)-q2*xf(a)) \quad (eq\ 6)$$

where:

a,b=x,y indices for measurements. They cover the range, a=1:Mx−1, b=1:My. They correspond with specific columns and rows of the projected overlay groups as illustrated in FIG. 20B.

(BBx, BBy)(a,b;X)=(x,y) box in box measurement results for the X-shears.

(xf(a), yf(b))=nominal projected overlay group (x,y) position within the image field. For a rectangular grid of overlay groups, these form a grid with pitch=p.

(dxf(a,b), dyf(a,b))=intra-field distortion at (x,y) intra-field position=(xf(a), yf(b)). These are the unknown quantities we wish to determine. The indices a, b cover the range: a=1:Mx, b=1:My.

(Tx1, Ty1, q1)=stage positioning error in (x, y, yaw) for the X shear exposure at nominal grid position (xX1, yX1).

(Tx2, Ty2, q2)=stage positioning error in (x, y, yaw) for the X shear exposure at nominal grid position (xX1+p+dp, yX1).

Yaw is simply the rotation induced by the wafer stage on the projected field.

The Y-shear measurements can be modeled as:

$$BBx(a,b;Y)=[xf(a)+dxf(a,b+1)+Tx3-q3*yf(b+1)]-[xf(a)+dxf(a,b)+Tx4-q4*yf(b)]=dxf(a,b+1)-dxf(a,b)+(Tx3-Tx4)-(q3*yf(b+1)-q4*yf(b)) \quad (eq\ 7)$$

$$BBy(a,b;Y)=[yf(b+1)+dyf(a,b+1)+Ty3+q3*xf(a)]-[yf(b)+p+dyf(a,b)+Ty4+q4*xf(a)]=dyf(a,b+1)-dyf(a,b)+(Ty3-Ty4)+(q3-q4)*xf(a) \quad (eq\ 8)$$

where:

a,b=x,y indices for measurements. They cover the range, a=1:Mx, b=1:My−.

(BBx, BBy) (a,b;Y)=(x,y) box in box measurement results for the Y-shears.

(Tx3, Ty3, q3)=stage positioning error in (x, y, yaw) for the Y shear exposure at nominal grid position (xY1, yY1).

(Tx4, Ty4, q4)=stage positioning error in (x, y, yaw) for the Y shear exposure at nominal grid position (xX1, yX1+p+dp)—and the other symbols are as above.

Figure 26:
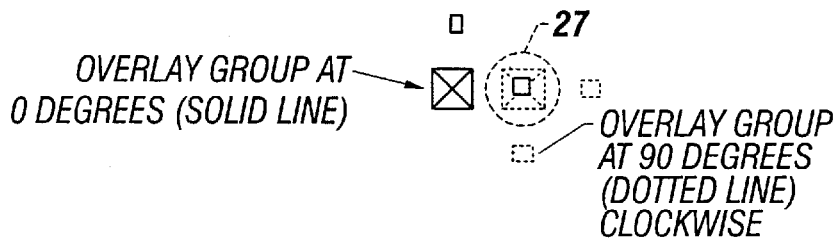
FIG. 26 shows a close-up of overlay groups for the R-shear.
Figure 27:
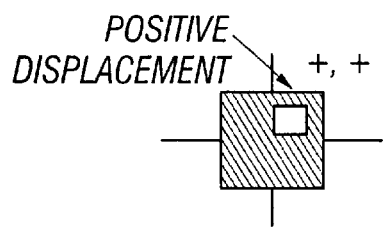
FIG. 27 shows a single box in box target.

In equations 5–8, the inner box occurs in the box in box measurements in such a way that the position of the inner box is shifted to the upper right hand corner (positive quadrant in x,y plane) of the outer box; the resulting box in box measurement is positive for both x and y components (BBx>0, BBy>0), See FIGS. 26 and 27.

Equations 5–8 are typically over-determined in the sense of equation counting; there are more equations than unknowns, but are still singular in the mathematical sense; there is an ambiguity in the solution of these equations. The unknowns in equations 5–8 are the intra-field distortion map (dxf(a,b), dyf(a,b)), and all of the stage positioning and yaw errors (Tx1,Ty1,q1), . . . (Tx4,Ty4,q4). Now it can be mathematically shown that we can solve for the distortion map (dxf(a,b), dyf(a,b)) uniquely to within a translation, rotation, orthogonality, and x and y scale factors. Put differently, if (dxf(a,b), dyf(a,b)) is a solution to equations 5–8, then (dxf(a,b)αTx−(q−qo)*yf(b)+sx*xf(a), dyf(a,b)+Ty+q*xf(a)+sy*yf(b)) is also a solution of equations 5–8 where:

Tx, Ty=arbitrary translation, q=arbitrary rotation, qo=arbitrary orthogonality sx=arbitrary x-scale or x-magnification error sy=arbitrary y-scale or y-magnification error.

To uniquely define a solution we can require that the computed solution have zero values for these modes. Then:

$$\Sigma dxf(a,b)=0 \text{ no x translation in intra-field distortion} \quad (eq\ 9)$$

$$\Sigma dyf(a,b)=0 \text{ no y translation in intra-field distortion} \quad (eq\ 10)$$

$$\Sigma xf(a)*dyf(a,b)=0 \quad (eq\ 11)$$

$$\Sigma yf(b)*dxf(a,b)=0 \quad (eq\ 12)$$

$$\Sigma xf(a)*dxf(a,b)=0 \text{ no x-scale or x-magnification error} \quad (eq\ 13)$$

$$\Sigma yf(b)*dyf(a,b)=0 \text{ no y-scale or y-magnification error} \quad (eq\ 14)$$

where Σ denotes summation over all intra-field grid points (a=1:Mx, b=1:My). Equations 11 and 12 together are interpreted as meaning there is no rotation or non-orthogonality. Equations 9–14 represent the preferred embodiment for the determination of the intra-field distortion since it can be shown that when it is so determined, the stage errors in translation and yaw are completely decoupled from the resulting intra-field grid distortion. Put differently, the intra-field distortion so determined is completely independent of wafer stage error, wafer alignment error, and reticle alignment error.

Equations 5–8 are typically solved using the singular value decomposition to produce the minimum length solution. See Numerical Recipes, The Art of Scientific Computing, W. Press, et. Al, Cambridge University Press, 52:64, 1990. It can be shown that the constraints of equations 9–14 effectively define a unique solution within the null space of equations 5–8, and therefore they can be applied after the minimum length solution (dxfm, dyfm) has been determined.

Then solving for Tx, Ty, q, qo, sx, sy from the equations:

$$\Sigma dxfm(a,b)+Tx-(q-qo)*yf(b)+sx*xf(a)=0 \quad (eq\ 14)$$

$$\Sigma dyfm(a,b)+Ty+q*xf(a)+sy*yf(b)=0 \quad (eq\ 15)$$

$$\Sigma xf(a)*(dyfm(a,b)+Ty+q*xf(a)+sy*yf(b))=0 \quad (eq\ 16)$$

$$\Sigma yf(b)*(dxfm(a,b)+Tx(q-qo)*yf(b)+sx*xf(a))=0 \quad (eq\ 17)$$

$$\Sigma xf(a)*(dxfm(a,b)+Tx-(q-qo)*yf(b)+sx*xf(a))=0 \quad (eq\ 18)$$

$$\Sigma yf(b)*(dyfm(a,b)+Ty+q*xf(a)+sy*yf(b))=0 \quad (eq\ 19)$$

and the intra-field distortion array satisfying eq 14–19 is:

$$dxf(a,b)=dxfm(a,b)+Tx-(q-qo)*yf(b)+sx*xf(a) \quad (eq\ 20)$$

$$dyf(a,b)=dyfm(a,b)+Ty+q*xf(a)+sy*yf(b) \quad (eq\ 21)$$

At this point the final results of the intra-field lens distortion can be recorded in tabular form as shown in FIG. 36.

Further Embodiments

In another embodiment, if it is believed or there is evidence that the wafer stage and reticle alignment system are extremely accurate and repeatable (for example if the accuracy and repeatability <~overlay metrology tool accuracy and repeatability), then all stage positioning and yaw errors (Tx1,Ty1,q1), . . . (Tx4,Ty4,q4) can be set to zero in equations 5–8. Not solving for the T's and q's allows determining the intra-field distortion uniquely to within an overall translation. That is, a unique solution that includes field rotation, orthogonality, and x and y scale is obtained if the constraints of equation 9 and equation 10 through equations 14 and 15 are imposed and then calculate (dxf, dyf) using the resulting Tx, Ty values and setting q=qo=sx=sy=0 in equations 20 and 21.

Analysis of the solutions of eq. 5–8 shows that the influence of overlay metrology tool measurement repeatability upon the resulting intra-field distortion map is minimal. If, so1 is the one sigma, one axis overlay metrology tool statistical repeatability, then in general, the root mean square (RMS) error this induces on the intra-field distortion at point (xf(a), yf(b)) is given by;

$$\sigma x(a,b)=Cx(a,b)*so1 \quad (eq\ 22)$$

$$\sigma y(a,b)=Cy(a,b)*so1 \quad (eq\ 23)$$

where;

σx(a,b)/σy(a,b)=RMS error in dxf(a,b)/dyf(a,b)

Cx(a,b)/Cy(a,b)=x/y error multipliers at intra-field point (xf(a), yf(b)).

The error multipliers (Cx, Cy) can be calculated for each intra-field point. In general, error multipliers near the edge or corner of the Mx×My intra-field point array are larger than error multipliers near the center of the array. These error multipliers typically increase as ln(Mx*My). For the specific case of a square array (Mx=My), the error multiplier at the worst point in the array is given approximately by;

$$Cworst=0.17+0.167*\ln(Mx*My) \quad (eq\ 24)$$

where ln is the Napierian or base e logarithm.

So for an Mx×My=11×11 array, eq 24 would predict a worst error multiplier, Cworst=0.97. The average error multiplier is typically ~30% smaller than the worst or Cavg ~0.68. From this discussion it can be seen that by combining measurements together we have reduced the effect of measurement noise leading to a practical, robust, noise resistant procedure for determining intra-field distortion. Furthermore, other embodiments that include more shears, that is displacements of the arrays with respect from each other, than the explicitly enumerated case of an X and Y shear, will lead to even further decreases in the intra-field error multipliers. It is also clear from this discussion, that arrangements having in addition to the X, Y shear, shears that cover the edges and corners and that are measured only at the edges and 2 or more overlay groups deep around the edge of interest, or measured only at the corners and 3 or more overlay groups deep around the corner of interest will further reduce the error multipliers at the highest or worst places.

Second Main Embodiment

Figure 22:
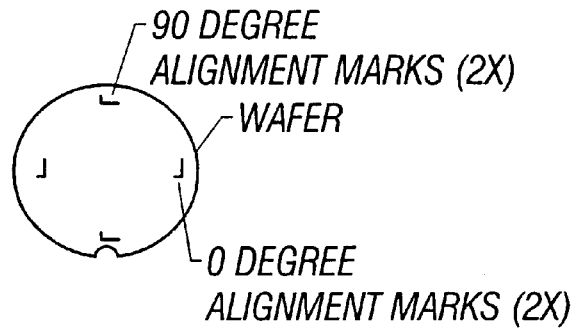
FIG. 22 shows a wafer with alignment marks at 0 and 90 degrees.
Figure 23:
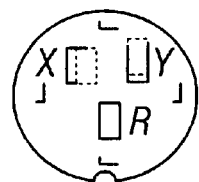
FIG. 23 shows a wafer after exposure of the 0 degree orientation patterns.

Yet another embodiment allows for the extraction of lens distortion placement error excluding total translation, rotation, and overall scale or magnification overlay error and is mathematically decoupled from stage error. FIG. 15 illustrates this embodiment in terms of a process flow diagram. First in block 1502, a wafer is provided. Typically it already has alignment marks suitable for use at normal orientation (0 degrees) and when rotated by 90-degrees as shown in FIG. 22. In cases where the projection imaging tool, or machine, is capable of realigning an unpatterned wafer after a 90-degree rotation to <2 microns, the alignment marks are not required. Next in block 1504, the wafer is coated with photoresist, loaded onto the machine, and possibly aligned. A reticle pattern for example the reticle shown in FIG. 20, consisting of a two dimensional array of box structures or targets of various sizes as shown in FIG. 20A is loaded into the machine's reticle management system and aligned to the reticle table in block 1506. This reticle pattern includes an Nx×Ny array of overlay groups shown in one embodiment in FIG. 20 with a portion of the whole Nx×Ny array being shown in FIG. 9. The reticle pattern is exposed in blocks 1508, 1510, and 1512 at three field positions across the wafer, shown by (solid outlines in FIG. 23, with the field centers at nominal grid positions (xX1,yX1), (xY1, yY1), (xR1, yR1), representing the first exposure for the X-shear, Y-shear and R-shear respectively. To minimize confusion, these exposure fields are typically separated by a distance >120%*max(Lx, Ly), where the exposure field has rectangular dimension Lx×Ly. Each full-field exposure produces an Mx×My array (Mx<=Nx, My<=Ny) of overlay groups at the wafer surface shown by the solid line overlay groups of FIGS. 11, 12, 25.

Figure 11:
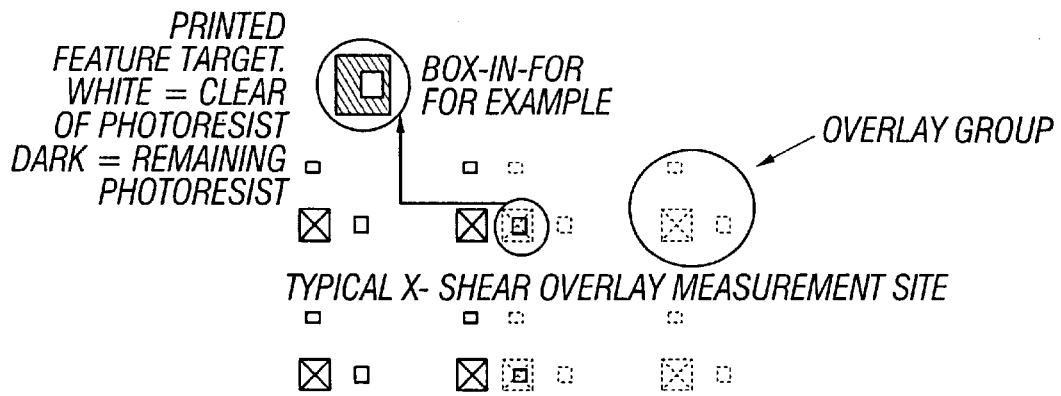
FIG. 11 is a schematic of the X-shear overlay on the wafer.
Figure 24:
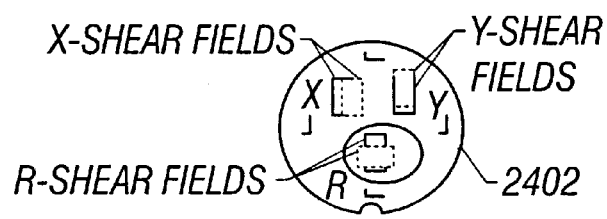
FIG. 24 shows a wafer after exposure of the 0 and 90 degree orientation patterns

Using the same reticle the wafer stage is blind stepped to expose the second layer of the X-shear pattern with field center located at nominal grid position (xX1+p+dp, yX1). Referring to FIGS. 5, 6, 7, 8, and 9, p is the feature pitch or period of the overlay set or group as shown in FIG. 10, as projected onto the wafer (p=reticle pitch/M=tool demagnification) and dp is the offset of the inner box structures. A portion of the resulting overlapped X-shear pattern is schematically shown in FIG. 11. The entire X-shear pattern consists of a set of Mx−1×My overlapped box in box structures illustrated in FIGS. 24–25. Typical values for p are in the range of about 0.5 mm to about 10 mm while typical values for dp are in the range of about 0.02 mm to about 1 mm. A constraint on p is that it be small enough to provide detailed enough coverage of the lens distortion pattern, while constraint on offset dp is that it lie within an isoplanatic distortion patch of the lens.

Figure 12:
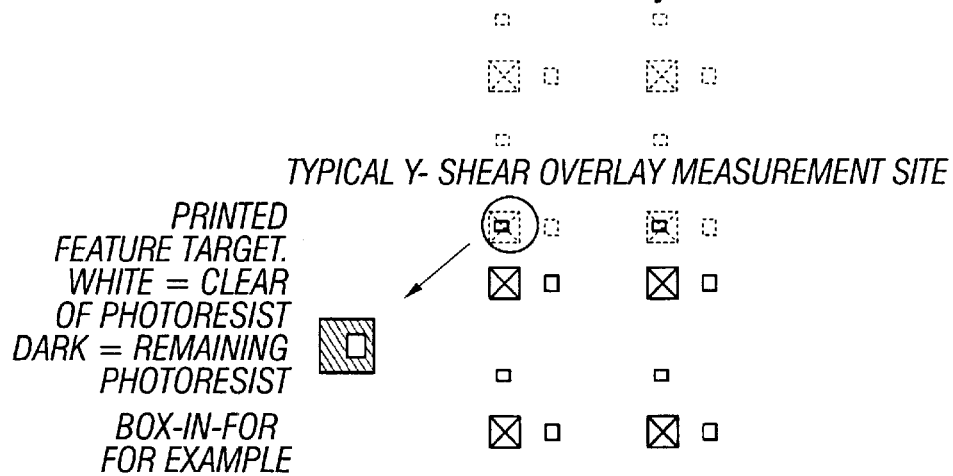
FIG. 12 is a schematic of the Y-shear overlay on the wafer.

Again using the same reticle the wafer stage is blind stepped to expose the second layer of the Y-shear pattern with field center located at nominal grid position (xY1, yY1+p+dp). A portion of the overlapped Y-shear pattern is schematically shown in FIG. 12. The entire pattern consists of a set of Mx×My−1 overlapped box in box structures.

Figure 13:
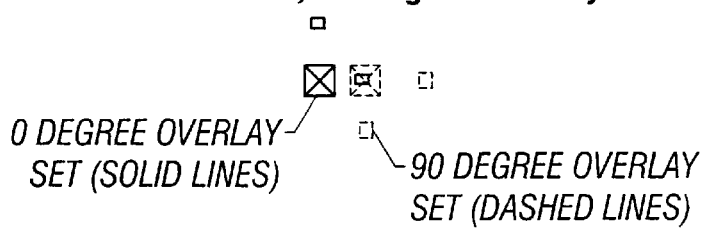
FIG. 13 is a 2-Dimensional reticle schematic, 90 degree overlay of R-shear.
Figure 25:
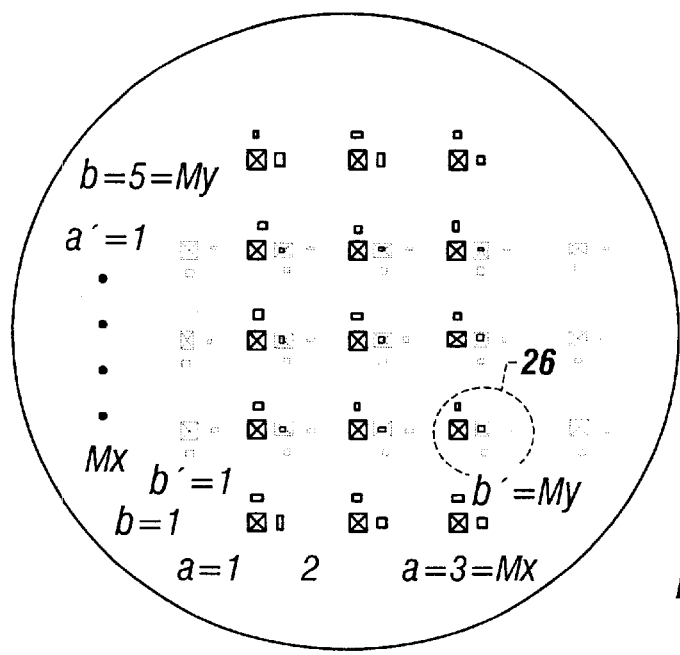
FIG. 25 shows a detail of the R-shear.

Next in block 1514, the wafer is rotated 90-degrees, counterclockwise for our example, possibly aligned off of the 90-degree wafer alignment marks and the reticle exposed in block 1516 at nominal grid position (−yR1, xR1+dp). The resulting overlapped R-shear pattern is schematically shown in FIG. 13 and FIG. 25 and consists of a set of min(Mx, My)×min(Mx, My) overlapped box in box structures, where min is the minimum value of the pair.

Next in block 1518, the wafer is developed and sent to the overlay tool where in block 1520 we measure the following sets of overlay targets:

$$\text{X-shears } Mx-1 \times My \quad (\text{eq } 25)$$

$$\text{Y-shears } Mx \times My-1 \quad (\text{eq } 26)$$

$$\text{R-shears } \min(Mx, My) \times \min(Mx, My) \quad (\text{eq } 26.1)$$

Then, in block 1522 the overlay measurements are used to produce the lens distortion map.

The X-shear measurements can be modeled as:

$$BBx(a,b;X)=[xf(a+1)+dxf(a+1,b)+$$

$$Tx1-q1*yf(b)]-$$

$$[xf(a)+p+dxf(a,b)+$$

$$Tx2-q2*yf(b)]$$

$$=dxf(a+1,b)-dxf(a,b)+$$

$$(Tx1-Tx2)-(q1-$$

$$q2)*yf(b) \quad (\text{eq } 27)$$

$$BBy(a,b;X)=[yf(b)+$$

$$dyf(a+1,b)+Ty1+q1*xf(a+1)]-$$

$$[yf(b)+dyf(a,b)+$$

$$Ty2+q2*xf(a)]$$

$$=dyf(a+1,b)-dyf(a,b)+$$

$$(Ty1-Ty2)+(q1*xf(a+1)-q2*xf(a)) \quad (\text{eq } 28)$$

where:
- a,b=x,y indices for measurements. They cover the range, a=1:Mx−1, b=1:My.
- (BBx, BBy) (a,b;X)=(x,y) box in box measurement results for the X-shears.
- (xf(a), yf(b))=nominal projected overlay group (x,y) position within the image field. Forms a rectangular grid.
- (dxf(a,b), dyf(a,b))=lens distortion at (x,y) field position= (xf(a), yf(b)).
- (Tx1, Ty1, q1)=stage positioning error in (x,y,yaw) for the X shear exposure at nominal grid position (xX1, yX1).
- (Tx2, Ty2, q2)=stage positioning error in (x,y,yaw) for the X shear exposure at nominal grid position (xX1+p+dp, yX1).

The Y-shear measurements can be modeled as:

$$BBx(a,b;Y)=[xf(a)+dxf(a,b+1)+$$

$$Tx3-q3*yf(b+1)]-$$

$$[xf(a)+dxf(a,b)+$$

$$Tx4-q4*yf(b)]$$

$$=dxf(a,b+1)-dxf(a,b)+$$

$$(Tx3-Tx4)-(q3*yf(b+$$

$$1)-q4*yf(b)) \quad (\text{eq } 29)$$

$$BBy(a,b;Y)=[yf(b+1)+$$

$$dyf(a,b+1)+Ty3+q3*$$

$$xf(a)]-$$

$$[yf(b)+p+dyf(a,b)+$$

$$Ty4+q4*xf(a)]$$

$$=dyf(a,b+1)-dyf(a,b)+$$

$$(Ty3-Ty4)+(q3-q4)*xf(a) \quad \text{(eq 30)}$$

where:
- a,b=x,y indices for measurements. They cover the range, a=1:Mx, b=1:My−1.
- (BBx, BBy) (a,b;Y)=(x,y) box in box measurement results for the Y-shears.
- (Tx3, Ty3, q3)=stage positioning error in (x,y,yaw) for the Y shear exposure at nominal grid position (xY1, yY1).
- (Tx4, Ty4, q4)=stage positioning error in (x,y,yaw) for the Y shear exposure at nominal grid position (xY1, yY1+p+dp)—and the other symbols are as above.

The R-shear measurements can be modeled as:

$$BBx(a,b;R)=[xR1+xf(a)+dxf(a,b)+Tx5-q5*yf(b)]-$$

$$[xR1+xf(a)+dyf(a'(b),b'(a))+Tx6-q6*yf(b)]$$

$$=dxf(a,b)-dyf(a'(b),b'$$

$$(a))+(Tx5-Tx6)-(q5-q6)*yf(b) \quad \text{(eq 31)}$$

$$BBy(a,b;R)=[yR1+yf(b)+$$

$$dyf(a,b)+Ty5+q5*xf(a)]-$$

$$[yR1+yf(b)+dxf(a'$$

$$(b),b'(a))+Ty6+q6*yf(b)]$$

$$=dyf(a,b)+dxf(a'(b),b'$$

$$(a))+(Ty5-Ty6)+(q5-q6)*xf(a) \quad \text{(eq 32)}$$

where:
- a,b=x,y indices for measurements. They cover the range, a=1:Mx, b=1+(My−Mx)/2:(My+Mx)/2
- a'(b)=(My+Mx)/2+1−b (where a' represents the rotated overlay group)
- b'(a)=(My−Mx)/2+a
- (BBx, BBy)(a,b;R)=(x,y) box in box measurement results for the R-shears.
- (Tx5, Ty5, q5)=stage positioning error in (x,y,yaw) for the R shear exposure at nominal grid position (xR1, yR1).
- (Tx6, Ty6, q6)=stage positioning error in (x,y,yaw) for the R shear exposure at nominal grid position (−yR1, xR1+dp)—and the other symbols are as above.

The ranges of a,b,a',b' are determined by the need to overlap the rectangular Mx×My array of overlay groups when they are placed at right angles to each other as illustrated in FIG. 25. When Mx<=My the index ranges will be as above.

When Mx>My, we have;
- a=1+(Mx−My)/2:(Mx+My)/2
- b=1:My
- a'(b)=(Mx+My)/2+1−b
- b'(a)=(Mx−My)/2+a.

In equations 27–32, the inner box occurs in the box in box measurements in such a way that the position of the inner box is shifted to the upper right hand corner (positive quadrant in x,y plane) of the outer box, the resulting box in box measurement is positive for both x and y components (BBx>0, BBy>0) see FIG. 27.

Equations 27–32 are typically over-determined in the sense of equation counting, there are more equations than unknowns, but are still singular in the mathematical sense; there is an ambiguity in the solution of these equations. The unknowns in equations 27–32 are the intra-field distortion map (dxf(a,b), dyf(a,b)), and all of the stage positioning and yaw errors (Tx1,Ty1,q1), . . . (Tx6,Ty6,q6). Now it can be mathematically shown that we can solve for the distortion map (dxf(a,b), dyf(a,b)) uniquely to within a translation, rotation, and an overall scale or symmetric magnification. Put differently, if (dxf(a,b), dyf(a,b)) is a solution to equations 6–11, then (dxf(a,b)+Tx−q*yf(b)+s*xf(a), dyf(a,b)+Ty+q*xf(a)+s*yf(b)) is also a solution of equations 27–32 where:

- Tx, Ty=arbitrary translation,
- q=arbitrary rotation,
- s=arbitrary overall scale or magnification error.

To uniquely define a solution we can require that the computed solution have zero values for these modes. Then:

$$\Sigma dxf(a,b)=0 \text{ no x translation in intra-field distortion} \quad \text{(eq 33)}$$

$$\Sigma dyf(a,b)=0 \text{ no y translation in intra-field distortion} \quad \text{(eq 34)}$$

$$\Sigma xf(a)*dyf(a,b)-yf(b)*dxf(a,b)=0 \text{ no rotation in intra-field distortion} \quad \text{(eq 35)}$$

$$\Sigma xf(a)*dxf(a,b)+yf(b)*dyf(a,b)=0 \text{ no overall scale or symmetric magnification in intra-field distortion} \quad \text{(eq 36)}$$

Σ denotes summation over all intra-field grid points (a=1:Mx, b=1:My). Equations 33–36 represent the preferred technique for the determination of the intra-field distortion since it can be shown that when it is so determined, the stage errors in translation and yaw are completely decoupled from the resulting intra-field grid distortion. Put differently, the intra-field distortion is completely determined independent of wafer stage error, wafer alignment error, and reticle alignment error.

Equations 27–32 are typically solved using the singular value decomposition to produce the minimum length solution. See Numerical Recipes, The Art of Scientific Computing, supra. It can be shown that the constraints of equations 33–36 effectively define a unique solution within the null space of equations 27–32, and therefore they can be applied after the minimum length solution (dxfm, dyfm) has been determined.

Solve for Tx, Ty, q, s, from the equations:

$$\Sigma dxfm(a,b)+Tx-q*yf(b)+s*xf(a)=0 \quad \text{(eq 37)}$$

$$\Sigma dyfm(a,b)+Ty+q*xf(b)+s*yf(b)=0 \quad \text{(eq 38)}$$

$$\Sigma xf(a)*(dyfm(a,b)+Ty+q*xf(b)+s*yf(b))-yf(b)*(dxfm(a,b)+Tx-q*yf(b)+s*xf(a))=0 \quad \text{(eq 39)}$$

$$\Sigma xf(b)*(dxfm(a,b)+Tx-q*yf(b)+s*xf(a))+yf(a)*(dyfm(a,b)+Ty+q*xf(b)+s*yf(b))=0 \quad \text{(eq 40)}$$

and the intra-field distortion array satisfying eq 37–40 is:

$$dxf(a,b)=dxfm(a,b)+Tx-q*yf(b)+s*xf(a) \quad \text{(eq 41)}$$

$$dyf(a,b)=dyfm(a,b)+Ty+q*xf(a)+s*yf(b) \quad \text{(eq 42).}$$

With regard to error multipliers, the effect of including the R-shears in these calculations is to further reduce the error multipliers from the X, Y shear case since including more measurements increases the averaging of overlay metrology tool noise and thereby decreases it's influence.

At this point the intra-field distortion (dxf, dyf) has been determined to within a translation, rotation, and an overall scale or symmetric magnification factor and can present and further utilize these results when they are presented in the form of either a text, as shown in FIG. 36, or electronic table.

Variation of the Second Embodiment

In another embodiment, if it is believed, or there is evidence, that the water stage and reticle alignment system are extremely accurate and repeatable, for example if the accuracy and repeatability <~overlay metrology tool accuracy/repeatability, then all stage positioning and yaw errors (Tx1,Ty1,q1), . . . (Tx6,Ty6,q6) can be set to zero in equations 27–32. Not solving for the T's and q's allows determining the intra-field distortion uniquely to within an overall translation. That is, a unique solution is obtained that includes field rotation and overall scale if the constraints of equation 33 and equation 34 through equations 37 and 38 are imposed and then calculate (dxf, dyf) using the resulting Tx, Ty values and setting q=s=0 in equations 41 and 42.

Reticle Plate Fabrication

The reticle plate for the preferred embodiment is shown in FIG. 20. The preferred embodiment makes no strict requirements on the size of the reticle plate, the shape of the overlay target patterns or the types of materials used to fabricate the mask plate for example, see FIGS. 20, 32, 33, and 33A. Hundreds of different overlay target patterns are available. See Direct-referencing automatic two-points reticle-to-wafter alignment using a projection column servo system, M. Van den Brink, H. Londers, S. Wittekoek, SPIE Vol. 633, Optical Microlithography V, 60:71, 1986. The preferred embodiment will work with any stepper or scanner system using any type of optical overlay targets or alignment attributes.

Heretofore, we have considered the reticle creating the overlay patterns as perfect. In practice, errors in the reticle manufacture can be taken into account by first measuring the position of all the individual structures in all of the overlay groups using an absolute metrology tool such as the Nikon 5I. See Measuring system XY-5I, supra, or Leica LMS IPRO; See Leica LMS IPRO brochure, supra, series tools. Next, in formulating equations 5–8, this reticle error, divided by the lithographic projection tool demagnification, is explicitly written out on the right hand side and then subtracted from the resulting overlay measurements on the left hand side of the equations, thereby canceling out on the right hand side. The result is equations 5–8 as they are written above but with a correction applied to the overlay measurements appearing on the left hand side. The discussion of the solution of these equations then proceeds word for word as before.

Further Discussion and Embodiments

The previous embodiments allow us to extract the intra-field distortion with high accuracy and arbitrary spatial resolution. One key assumption has been that the intra-field distortion (dxf, dyf) is constant from exposure to exposure. This is certainly true over short (<1-day) time intervals under normal operating conditions for steppers or step and repeat (stepper) projection systems. See Optical Lithography—Thirty years and three orders of magnitude, supra] where the intra-field distortion is entirely due to lens aberrations or reticle misalignment. It is also true of step and scan (scanner) systems for exposures that are static; that is the scanning mechanism is not employed during the exposure so that only the strip or annular field; See Optical Lithography—Thirty years and three orders of magnitude, supra of the projection lens determines the field size. In these cases, it is possible to determine the distortion of the static lens field. More generally, the technique of this invention can be applied without loss of accuracy due to non-repeatability in time of the intra-field distortion to any projection lithographic system operated in a mode where the source of the intra-field distortion is constant over short time periods.

In scanners, there is always a distortion contribution from non-repeatable synchronization of the wafer and reticle stages during the scanning action; this is evident from single machine overlay results. See 0.7 NA DUV step and Scan system for 150 nm Imaging with Improved Overlay, J. V. Schoot, SPIE vol. 3679, 448:463, 1999. The technique can still be applied in these situations if this non-repeatability is small enough then there is little to no increase in the error of determination of (dxf, dyf). Larger non-repeatabilities in the intra-field error may require applying the technique multiple times to the same machine to determine in each instance the intra-field distortion. These separate instances of intra-field distortion are then averaged to get an estimate of the repeatable part of the intra-field-distortion. Deviations in the data from this average value allow estimating the standard deviation of the intra-field distortion from the repeatable component. Again, this technique can be used in the presence of other non-repeatabilities in the intra-field distortion such as those caused by electron optics in e-beam lithography.

Figure 34A:
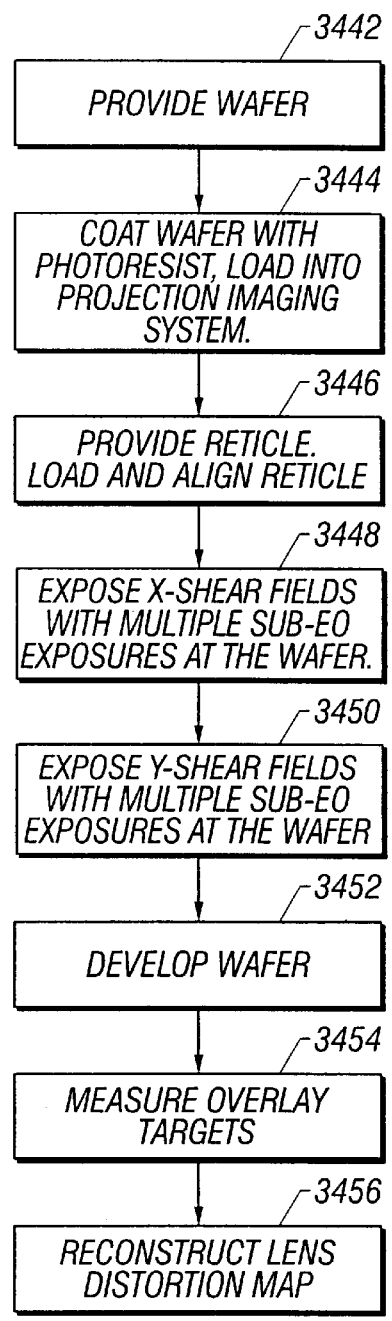
FIG. 34A shows a process flow for the alternate embodiment utilizing sub-Eo exposure doses on the wafer.

A variation of the first two embodiments that allows the user to extract the repeatable part of the intra-field distortion with a minimum number of exposed fields and overlay metrology is described. Below, Eo is the E-zero or minimum exposure dose required for a large, i.e. 200 micron at wafer, open area pattern on the reticle to become fully developed, or cleared in the case of positive resist. FIG. 34A illustrates a process flow diagram where in blocks 3442, 3444 and 3446, the overlay target reticle and resist coated wafer are loaded into the projection imaging tool, or machine, as described above. Next in blocks 3448 and 3450, instead of exposing each field with a single scanning or exposing action, the machine is programmed to expose each field at a multiplicity of lower doses. So if a*Eo (a>1) is the required dose at the wafer to completely expose a single field with a single exposing action, we expose the field N times at a dose of a*Eo/N, where N is some predetermined number, typically 20. Within these N exposures the wafer stage is not moved to another field position, a single field is exposed N times. In the preferred embodiment, this process is repeated 3 more times for the other fields. The result of this procedure is to average out the scanning non-repeatability by an amount proportional to N (parameterized as b*M). The exact configuration of the resist (novolac, chemically amplified, resist manufacturer, processing conditions) determines whether b=1 or is <1.

If the machine cannot do the desired sub-Eo exposure, then we can use the lowest exposure dose available and expose enough fields with this dose so we get the desired averaging effect.

Then in blocks 3452, 3454, and 3456 the wafer is developed and the overlay targets are measured and a lens distortion map constructed as described above in connection with FIG. 34.

Figure 20C:
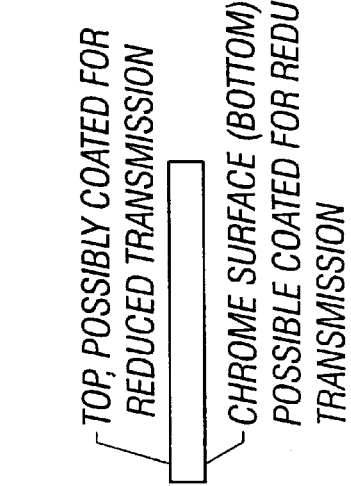
FIG. 20C shows a side view of reticle of FIG. 20.
Figure 21:
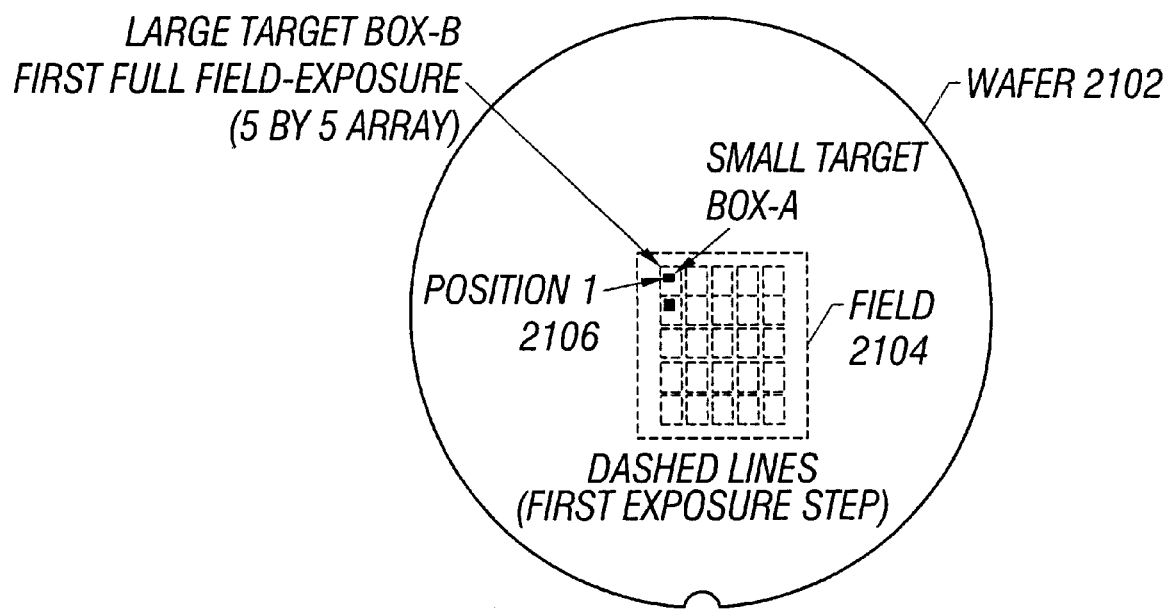
FIG. 21 is an example of a prior art lens distortion test.

In another variation of the first two embodiments, multiple exposing actions are performed to average out the effect of non-repeatability, but now the overlay reticle, for example the reticle of FIG. 20, has a partially reflecting dielectric coating either on its non-chrome or possibly chrome coated (machine optical object plane) surface see FIG. 20C. For example, a 95% reflecting dielectric coating applied to the overlay reticle means that if there are 20 exposure sequences, at a dose of Eo each, the net effect is to expose the wafer with a dose of 2*Eo and to have effectively averaged over as many as 20 exposures. The advantage of this technique is that it is not limited by the machine's ability to do sub-Eo exposures. A further advantage of this technique is that since the exposure doses can be made at the same dose as used in production runs, the dynamics of the scanner movement during the measurement sequence will be the same and therefore the intra-field error measured under identical operating conditions. Thus, if the production dose is a*Eo, the overlay reticle has a coating that reflects a fraction R of light incident on it, then the number of exposures (N) required to get a dose of b*Eo on the measurement wafer is:

$$N=1+\text{floor}(b/(a*(1-R))) \qquad (\text{eq } 43)$$

and floor(x)=integer part of the real number x.

As a typical example, a production run at 4*Eo (a=4), using an overlay reticle that is 98% reflecting (R=0.98) and requiring a dose on the measurement wafers of 2*Eo (b=2) means the number of required exposures is (eq 43) N=26 resulting in effectively averaging over as many as 26 realizations of the intra-field distortion. Furthermore, even though the exposure dose was set at the production dose (4*Eo), the dose at the wafer was sub-Eo (less than Eo) because it is equal to (1−R)*4*Eo=0.08*Eo or 8% of Eo. Although this embodiment was described with respect to a partially reflecting reticle, the considerations are similar if the overlay reticle is absorbing or attenuated. An attenuated phase shift mask is well suited for this purpose. See The Attenuated Phase Shift Mask, B. Lin. Instead of reflecting; all that is required is a reticle with a decreased optical transmission from normal. To be useful, the reticle typically needs an optical transmission (1−R for a reflective mechanism) of <50% of normal or nominal.

Figure 1:
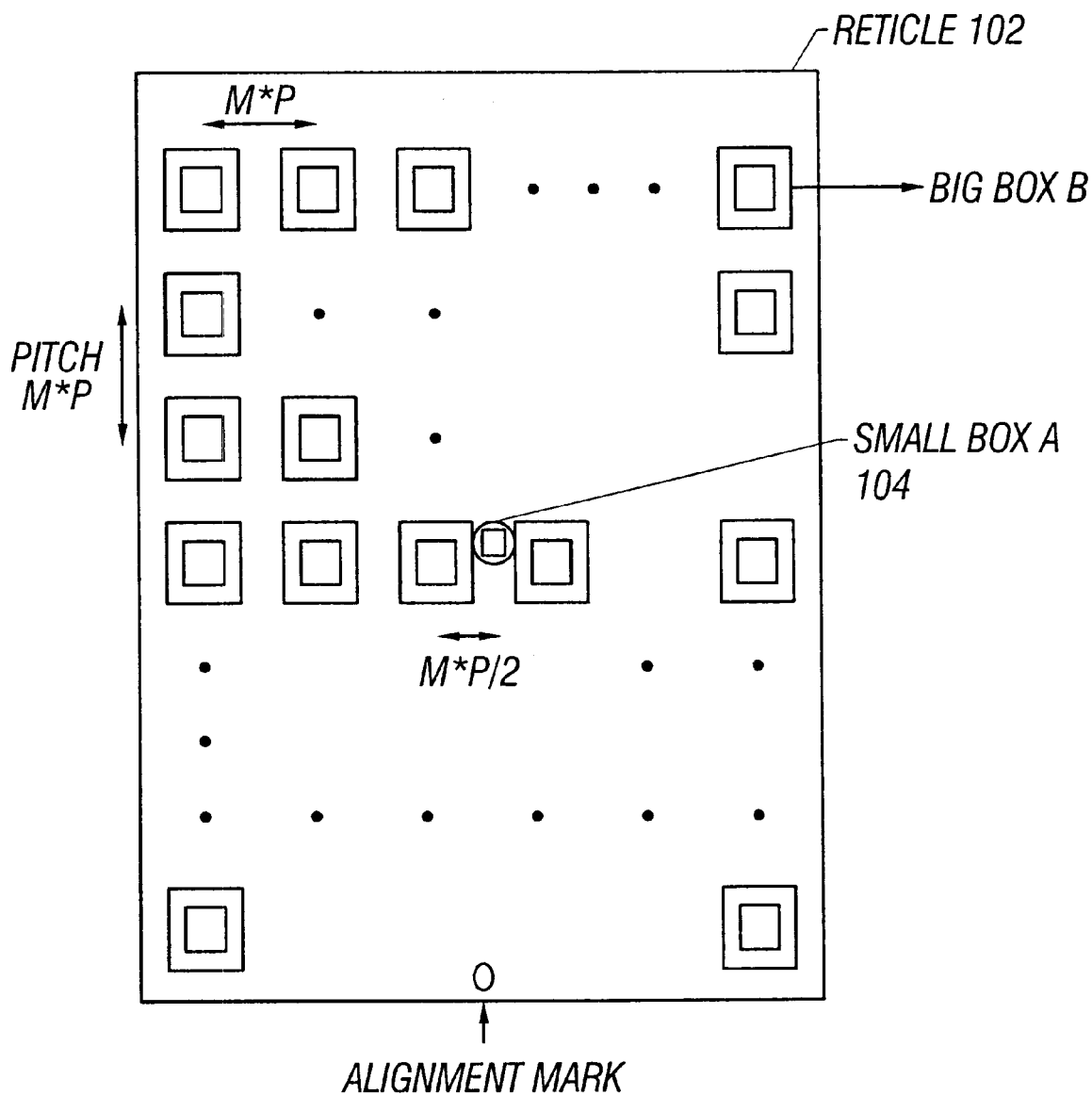
FIG. 1 shows a reticle schematic.
Figure 2:
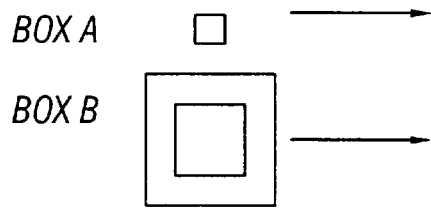
FIG. 2 shows schematics for FIG. 1.
Figure 3:
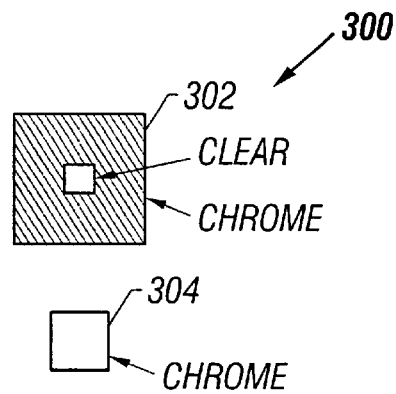
FIG. 3 shows the reticle features corresponding to the schematics of FIG. 2.
Figure 4:
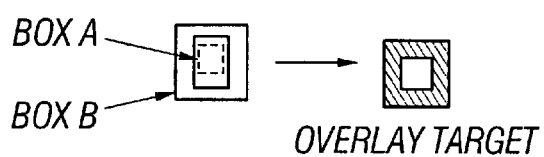
FIG. 4 shows example of overlapping regions.
Figure 4A:
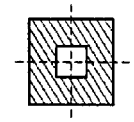
FIG. 4A shows a perfectly centered box in box structure.

The techniques described above has been mainly described with respect to alignment attributes that are in the form of a box in box or frame in frame pattern as shown in FIG. 14. Other alignment attributes such as gratings can be used. See U.S. Pat. No. 6,079,256—Overlay Alignment Measurement of Wafter, supra, and FIG. 1b, wafer alignment marks See Matching Management of multiple wafer steppers using a stable standard and a matching simulator, supra, van der Pauw resistors. See Automated Electrical Measurements of Registration Errors in Step and Repeat Optical Lithography systems, supra, vernier pairs; See Method of Measuring Bias and Edge overlay error for sub 0.5 micron Ground Rules, C. Ausschnitt, et. Al., U.S. Pat. No. 5,757,507, 1998, capacitor structures. See Capacitor Circuit Structor For Determining Overlay Error, supra could be used instead. In general, any alignment attribute that can be used by an overlay metrology tool for measuring offsets can be utilized by the techniques described.

The overlay metrology tool utilized in the techniques described is typically a conventional optical overlay tool such as those manufactured by KLA-Tencor. See KLA 5105 overlay brochure, supra; 5200 overlay brochure, supra or Bio-Rad Semiconductor Systems; See Quaestor Q7 Brochure, supra. Other optical overlay tools can also be used by, for example, those described in Process for measuring overlay misregistration during semiconductor wafer fabrication, I. Mazor, et Al., U.S. Pat. No. 5,438,413 1995 or Overlay Alignment Measurement of Wafers, supra. In addition, some steppers or scanners. See Matching Management of multiple wafer steppers using a stable standard and a matching simulator, supra can utilize their wafer alignment systems and wafer stages to function as overlay tools. However, in this role the total size of the alignment attribute is usually limited, (consisting of 2 wafer alignment marks) to a distance over which the wafer stage would be as accurate as a conventional optical overlay tool. This distance is typically <0.5 mm. When electrical alignment attributes are used for overlay. See Matching Management of multiple wafer steppers using a stable standard and a matching simulator, supra; Automated Electrical Measurements of Registration Errors in Step and Repeat Optical Lithography systems, supra; See Capacitor Circuit Structor For Determining Overlay Error, supra, the overlay metrology tool as utilized by this invention would correspond to the electrical equipment utilized for making the corresponding measurement.

The techniques nave been mainly described with respect to its application on the projection imaging tools such as photolithographic stepper systems, See Direct-referencing automatic two-points reticle-to-wafer alignment using a projection column servo system, supra; New 0.54 Aperture I-Line Wafer Stepper With Field by Field Leveling Combined with Global Alignment, M. Van den Brink, B. Katz, S. Wittekoek, SPIE Vol. 1463, 709:724, 1991; Projection optical system for use in precise copy, T. Sato, et. Al., U.S. Pat. No. 4,861,148, 1989, and photolithographic scanners systems. See Micrascan (TM) III performance of a third generation, catadioptric step and scan lithographic tool, D. Cote, et. Al., SPIE Vol. 3051, 806:816, 1997; ArF Step And Scan Exposure System For 0.15 Micron and 0.13 micron Technology Node, J. Mulkens, et. Al., SPIE Conference on Optical Microlithography XII, 506:521, March, 1999; 0.7 NA DUV step and Scan system for 150 nm Imaging with Improved Overlay, supra, most commonly used in semiconductor manufacturing today. The techniques can be applied to other projection imaging tools such as contact or proximity printers. See Optical Lithography—Thirty years and three orders of magnitude, supra, 2-dimensional scanners; See Large-area, High-throughout, High-Resolution Projection Imaging System, K. Jam, U.S. Pat. No. 5,285,236, 1994, Optical Lithography—Thirty years and three orders of magnitude, supra, office copy machines, and next generation lithography (ngl) systems such as XUV. See Development of XUV projection lithography at 60–80 nm, supra, SCALPEL, EUV (Extreme Ultra Violet); See Reduction imaging at 14 nm using multilayer-coated optics: Printing of features smaller than 0.1 micron ef 53, supra, IPL (Ion Projection Lithography), and EPL (electron projection lithography). See Mix-And-Match: A necessary Choice, supra. In addition, the techniques can be applied to a lithographic projection system used in an electron beam imaging system, or a direct write tool, or an x-ray imaging system.

The reticle of the present invention is typically glass with openings defined in a chrome coating. This is common for projection lithography tools utilized in semiconductor manufacture. The form the reticle can take will be determined by the format required by the specific projection lithography tool on which the reticle is loaded.

The techniques have been mainly described with respect to the recording medium being positive photoresist. The technique could equally well have used negative photoresist providing appropriate adjustment to the box in box structures on the reticle are made. In general, the recording medium is whatever is typically used on the lithographic projection tool being measuring. Thus, on an EPL tool, an electron beam resist such as PMMA could be utilized as the recording medium.

So far, the substrates on which the recording media is placed have been described as semi conductor surfaces or silicon wafers. This will be the case in semiconductor manufacture. The exact form of the substrate will be dictated by the projection lithography tool and its use in a specific manufacturing environment. For example, in a flat panel manufacturing facility, the substrate on which the photoresist would be placed would be a glass plate or panel. A projection imaging tool used in mask making would utilize a reticle, or a photolithographic mask, as the substrate. In addition, the substrate may be an electronic recording media, or an optically sensitive material, such as an electronic CCD, a diode array, or a liquid crystal material. Circuit boards or multi-chip module carriers are other possible substrates.

The overlay measurement and lens distortion algorithm can also be integrated directly into the exposure alignment systems of most stepper and scanner systems. For example, this could be in the form of an electronic sensing array embedded in the wafer chuck that would serve as both substrate and recording medium.

The present invention has been described above in terms of a presently preferred embodiment so that an understanding of the present invention can be conveyed. There are, however, many configurations for ownership interest award techniques not specifically described herein but with which the present invention is applicable. The present invention should therefore not be seen as limited to the particular embodiments described herein, but rather, it should be understood that the present invention has wide applicability with respect to ownership interest award techniques generally. All modifications, variations, or equivalent arrangements and implementations that are within the scope of the attached claims should therefore be considered within the scope of the invention.

We claim:

1. A method of determining intra-field distortion in a projection imaging tool, the method comprising:

exposing a reticle pattern onto a substrate with a recording media in a first position, wherein the reticle pattern includes at least two arrays of alignment attributes, the arrays of alignment attributes have features complementary to each other and the arrays have the same pitch and are offset from each other;

exposing the reticle pattern onto the substrate in a second position, wherein the reticle pattern in the second position overlaps the reticle pattern in the first position and is shifted in a desired direction by an amount that corresponds to the offset;

measuring positional offsets of the alignment attributes; and determining a lens distortion map from the resulting positional offset.

2. A method as defined in claim 1, wherein the desired direction corresponds to an X direction.

3. A method as defined in claim 1, wherein the desired direction corresponds to a Y direction.

4. A method as defined in claim 1, further comprising:

exposing the reticle pattern in a third position on the substrate, wherein the third position and the first position are separated by a desired distance; and exposing the reticle pattern in a fourth position on the substrate, wherein the fourth position overlaps the third position and is shifted in a second desired direction by an amount that corresponds to the offset.

5. A method as defined in claim 4, wherein the first desired direction corresponds to an X direction and the second desired direction corresponds to a Y direction.

6. A method as defined in claim 4, further comprising:

exposing a reticle pattern in a fifth position on the substrate, wherein the fifth position is separated from the first and third positions by a desired distance; and exposing the reticle pattern in a sixth position on the substrate, wherein the sixth position overlaps the fifth position and is shifted in a third desired direction by an amount that corresponds to the offset.

7. A method as defined in claim 6, wherein the third desired direction corresponds to a rotation.

8. A method as defined in claim 1, wherein the substrate is a semiconductor surface.

9. A method as defined in claim 1, wherein the substrate is a silicon wafer.

10. A method as defined in claim 9, wherein the silicon wafer is a notched wafer.

11. A method as defined in claim 1, wherein the substrate is a flat panel display.

12. A method as defined in claim 1, wherein the substrate is a reticle.

13. A method as defined in claim 1, wherein the substrate is a photolithographic mask.

14. A method as defined in claim 1, wherein the substrate is an electronic recording media.

15. A method as defined in claim 1, wherein the projection imaging tool is used in a photolithographic stepper system.

16. A method as defined in claim 1, wherein the projection imaging tool is used in a photolithographic scanner system.

17. A method as defined in claim 1, wherein the projection imaging tool is used in an electronic beam imaging system.

18. A method as defined in claim 1, wherein the projection imaging tool is used in a direct write tool.

19. A method as defined in claim 1, wherein the projection imaging tool is used in a SCALPEL tool.

20. A method as defined in claim 1, wherein the projection imaging tool is used in an extreme ultra-violet photolithographic tool.

21. A method as defined in claim 1, wherein the projection imaging tool is used in a x-ray imaging system.

22. A method as defined in claim 1, wherein the recording media is a positive resist material.

23. A method as defined in claim 1, wherein the recording media is a negative resist material.

24. A method as defined in claim 1, wherein the recording media is an electronic CCD.

25. A method as defined in claim 1, wherein the recording media is a diode array.

26. A method as defined in claim 1, wherein the recording media is a liquid crystal material.

27. A method as defined in claim 1, wherein the recording material is an optically sensitive material.

28. A method as defined in claim 1, wherein exposing the reticle pattern is at an exposure level below the minimum exposure dose of the recording media.

29. A method as defined in claim 28, wherein the reticle pattern is exposed a desired number of times.

30. A method of determining intra-field distortion in a projection imaging tool, the method comprising:

exposing a reticle pattern onto a substrate with a recording media in a first position, wherein the reticle pattern includes at least two arrays of alignment attributes, the arrays of alignment attributes have features complementary to each other and the arrays have the same pitch and are offset from each other;

exposing the reticle pattern onto the substrate in a second position, wherein the first and second positions are separated by a desired distance;

exposing the reticle pattern onto the substrate in a third position, wherein the reticle pattern in the third position overlaps the reticle pattern in the first position and is shifted in a first desired direction by an amount that corresponds to the offset;

exposing the reticle pattern onto the substrate in a fourth position, wherein the reticle pattern in the fourth position overlaps the reticle pattern in the second position and is shifted in a second desired direction by an amount that corresponds to the offset;

measuring positional offsets of the alignment attributes; and determining a lens distortion map from the resulting positional offset.

31. A method as defined in claim 30, wherein the first desired direction corresponds to an X direction.

32. A method as defined in claim 30, wherein the second desired direction corresponds to a Y direction.

33. A method as defined in claim 30, further comprising:

exposing a reticle pattern onto the substrate in a fifth position; and exposing a reticle pattern onto the substrate in a sixth position, wherein the sixth position overlaps the fifth position and is rotated by a desired amount with respect to the fifth position.

34. A method as defined in claim 33, wherein the rotation is 90 degrees.

35. A reticle for determining intra-field distortion in a projection imaging tool, the reticle comprising:

a first set of reticle alignment attributes in a pattern with a constant pitch selected to indicate the intra field distortion of a projection system; and a second set of reticle alignment attributes that are complementary to the first set of alignment attributes, the second set of alignment attributes in a pattern with the same pitch as the first set of alignment attributes and offset from the first set of alignment attributes by a desired amount.

36. A reticle as defined in claim 35, wherein a first instance of the second set of alignment attributes is offset from the first set of alignment attributes in a first direction, and a second instance of the second alignment attributes is offset from the first set of alignment attributes in a second direction that is distinct from the first direction.

37. A reticle as defined in claim 36, wherein the first and second direction are perpendicular to one another.

38. A reticle as defined in claim 36, wherein the alignment attributes are in a regular rectangular grid pattern.

39. A reticular as defined in claim 38, wherein the first direction is parallel to the axis of the rectangular grid.

40. A reticle as defined in claim 35, further comprising a partially reflecting dielectric coating.

41. A reticle as defined in claim 35, further comprising an attenuated phase shift mask.

42. A projection imaging tool comprising:

means for exposing a reticle pattern onto a substrate with a recording media in a first position, wherein the reticle pattern includes at least two arrays of alignment attributes such that the arrays of alignment attributes have features complementary to each other and the arrays have the same pitch and are offset from each other;

means for exposing the reticle pattern onto the substrate in a second position, wherein the reticle pattern in the second position overlaps the reticle pattern in the first position and is shifted in a desired direction by an amount that corresponds to the offset;

means for measuring positional offsets of the alignment attributes; and means for determining a lens distortion map from the resulting positional offset.

43. A reticle for determining intra-field distortion in a projection imaging tool, the reticle comprising:

means for positioning a first set of reticle alignment attributes arranged in a pattern with a constant pitch selected to indicate the intra field distortion of a projection system; and means for positioning a second set of reticle alignment attributes that are complementary to the first set of alignment attributes, such that the second set of alignment attributes are arranged in a pattern with the same pitch as the first set of alignment attributes and are offset from the first set of alignment attributes by a desired amount.

* * * * *

UNITED STATES PATENT AND TRADEMARK OFFICE
CERTIFICATE OF CORRECTION

PATENT NO. : 6,573,986 B2
DATED : June 3, 2003
INVENTOR(S) : Smith et al.

It is certified that error appears in the above-identified patent and that said Letters Patent is hereby corrected as shown below:

Title Page,
Item [56] References Cited, OTHER PUBLICATIONS, please insert the following data: "Goodwin et al.," please replace "Stepper Exposur Fields" with -- Stepper Exposure Fields --;
"MacMillen et al., " please replace "microlithographic reductio lens" with -- microlithographic reduction lens --;
Please replace "v.d. Brink" with -- van den Brink --;
"van den Brink et al.," "Matching of Multiple Wafer Steppers...", please replace "Advanced Optimizatio Schemes" with -- Advanced Optimization Schemes --;
"van den Brink et al.," "New 0 54 aperture...", please replace "With Glob Alignment" with -- With Global Alignment --;

Drawings,
Figures 11 and 12, the portion of the figure that reads "BOX-IN-FOR" should read as -- BOX-IN-BOX --;
Figure 20c, the portion of the figure that reads "POSSIBLE COATED" should read as -- POSSIBLY COATED --;

Column 1,
Line 62, the portion that reads as "et. Al.," should read as -- et al., --;

Column 2,
Line 41, please replace "M. Van den Brink et. Al.," with -- M. van den Brink et al., --;

Column 3,
Line 32, please replace "et. Al.," with -- et al., --;

Column 4,
Line 39, please replace "the this" with -- this --;

Column 5,
Line 3, please replace " its' " with -- its --;

Column 7,
Line 11, please remove the word "is";

Column 8,
Lines 14, 17, 24, 26-27 and 35, please replace "et. Al.," with -- et al., --;
Line 39, please replace "using variety" with -- using a variety --;
Line 46, please replace "et. al.," with -- et al., --;

UNITED STATES PATENT AND TRADEMARK OFFICE
CERTIFICATE OF CORRECTION

PATENT NO. : 6,573,986 B2
DATED : June 3, 2003
INVENTOR(S) : Smith et al.

It is certified that error appears in the above-identified patent and that said Letters Patent is hereby corrected as shown below:

Column 9,
Line 2, please replace "pattern be" with -- pattern can be --;
Line 3, please insert -- an -- following "example,";

Column 10,
Lines 50-51, (eq 8) should read as: -- BBy(a,b;Y) = [yf(b+l) + dyf(a,b+l) + Ty3 + q3*xf(a)] - [yf(b) + p + dyf(a,b) + Ty4 + q4*xf(a)] = dyf(a,b+l) - dyf(a,b) + (Ty3-Ty4) + (q3 - q4)*xf(a) --;

Column 11,
Line 51, please replace "et. Al.," with -- et al., --;

Column 19,
Line 35, please replace "has" with -- have --;
Line 40, please replace "Wafter," with -- Wafer, --;
Line 41, please replace "marks See" with -- marks. See --;
Lines 47 and 61, please replace "et. Al.," with -- et al., --;

Column 20,
Line 14, please replace "nave" with -- have --;
Lines 22, 26 and 28, please replace "et. Al.," with -- et al., --;

Column 22,
Lines 45-46, please replace claim 27 with the following claim:
27.    A method as defined in Claim 1, wherein the recording media is an optically sensitive material.

Signed and Sealed this

Second Day of December, 2003

JAMES E. ROGAN
*Director of the United States Patent and Trademark Office*